(12) United States Patent
Inoue

(10) Patent No.: US 9,275,734 B2
(45) Date of Patent: Mar. 1, 2016

(54) MEMORY HAVING INFORMATION REFINEMENT DETECTION FUNCTION BY APPLYING A LOGIC OPERATION IN PARALLEL FOR EACH MEMORY ADDRESS TO THE MATCH/MISMATCH RESULTS OF DATA ITEMS AND MEMORY ADDRESSES, INFORMATION DETECTION METHOD USING MEMORY, AND MEMORY ADDRESS COMPARISON CIRCUIT FOR THE MEMORY

(76) Inventor: Katsumi Inoue, Chiba (JP)

( * ) Notice: Subject to any disclaimer, the term of this patent is extended or adjusted under 35 U.S.C. 154(b) by 0 days.

(21) Appl. No.: 13/387,089

(22) PCT Filed: Feb. 17, 2011

(86) PCT No.: PCT/JP2011/053419
§ 371 (c)(1),
(2), (4) Date: Jan. 25, 2012

(87) PCT Pub. No.: WO2011/102432
PCT Pub. Date: Aug. 25, 2011

(65) Prior Publication Data
US 2012/0324204 A1    Dec. 20, 2012

(30) Foreign Application Priority Data

Feb. 18, 2010  (JP) ................................. 2010-033376
Mar. 4, 2010   (JP) ................................. 2010-047215
Mar. 23, 2010  (JP) ................................. 2010-065597
Apr. 6, 2010   (JP) ................................. 2010-087411
Aug. 2, 2010   (JP) ................................. 2010-173942
Dec. 2, 2010   (JP) ..................... PCT/JP2010/071550

(51) Int. Cl.
*G06F 12/00*     (2006.01)
*G11C 15/00*     (2006.01)
*G06F 17/30*     (2006.01)

(52) U.S. Cl.
CPC .......... *G11C 15/00* (2013.01); *G06F 17/30445* (2013.01); *G06F 17/30495* (2013.01)

(58) Field of Classification Search
CPC ........................... G06F 3/0638; G06F 12/0802
USPC ............ 711/103, 217, 221; 365/49.1, 189.07, 365/230.01
See application file for complete search history.

(56) References Cited

U.S. PATENT DOCUMENTS 5,946,704 A    8/1999  Yoneda
6,108,747 A    8/2000  Kaganoi
(Continued)

FOREIGN PATENT DOCUMENTS

JP    H02-116982 A    5/1990
JP    H05-298893 A    11/1993
(Continued)

OTHER PUBLICATIONS

Supplementary European Search Report EP 11 74 4718.

*Primary Examiner* — John Lane
(74) *Attorney, Agent, or Firm* — Konomi Takeshita

(57) ABSTRACT

There is provided an externally readable memory for storing information in each memory address, and this memory is provided with an information refinement detection function; this memory comprises: an input means for entering first input data for comparing data items stored in the memory and second input data for comparing addresses in the memory, wherein the first and second comparison data are externally; means for determining matches/mismatches of both data items stored in the memory and addresses of the memory according to both of the input data provided by the input means, and further performing logic operations on both of the match/mismatch determination results; and means for outputting addresses with positive results of the logic operations. This memory may be applicable in a broad range of fields including intelligent information search as well as artificial intelligence.

60 Claims, 23 Drawing Sheets

(56) References Cited

U.S. PATENT DOCUMENTS 7,861,030 B2 * 12/2010 Davis ........................ 711/108
2002/0122337 A1 9/2002 Kanazawa et al.

FOREIGN PATENT DOCUMENTS

| | | |
|---|---|---|
| JP | H06-44389 A | 2/1994 |
| JP | H06-348869 A | 12/1994 |
| JP | H07-105690 A | 4/1995 |
| JP | H10-28959 A | 2/1998 |
| JP | H10-289591 A | 10/1998 |
| JP | 2001-014333 A | 1/2001 |
| JP | 2001-229172 A | 8/2001 |
| JP | 2002-260389 A | 9/2002 |
| JP | 2003-036269 A | 2/2003 |
| JP | 2003-525511 A | 8/2003 |
| JP | 2004-502265 A | 1/2004 |
| JP | 2006-120321 A | 5/2006 |
| JP | 2008-108044 A | 5/2008 |
| JP | 4588114 B1 | 9/2010 |
| JP | 2012-252368 A | 12/2012 |
| WO | 01/65564 A1 | 9/2001 |
| WO | 02/01570 A1 | 1/2002 |
| WO | 02/082750 A | 10/2002 |
| WO | 03/030178 A1 | 4/2003 |

* cited by examiner

Fig. 9

MEMORY HAVING INFORMATION REFINEMENT DETECTION FUNCTION BY APPLYING A LOGIC OPERATION IN PARALLEL FOR EACH MEMORY ADDRESS TO THE MATCH/MISMATCH RESULTS OF DATA ITEMS AND MEMORY ADDRESSES, INFORMATION DETECTION METHOD USING MEMORY, AND MEMORY ADDRESS COMPARISON CIRCUIT FOR THE MEMORY

CROSS REFERENCE TO RELATED APPLICATIONS

This application claims priority under 35 U.S.C. 119 based upon Japanese Patent Application Serial No. 2010-033376, filed on Feb. 18, 2010, Japanese Patent Application Serial No. 2010-047215, filed on Mar. 4, 2010, Japanese Patent Application Serial No. 2010-065597, filed on Mar. 23, 2010, Japanese Patent Application Serial No. 2010-087411, filed on Apr. 6, 2010, Japanese Patent Application Serial No. 2010-173942, filed on Aug. 2, 2010, and International Patent Application No. PCT/JP2010/071550, filed on Dec. 2, 2010. The entire disclosures of which are incorporated herein by reference.

FIELD OF THE INVENTION

The present invention relates to a memory provided with an information refinement detection function, a method of detecting information using the memory, a device which includes the memory, a method of detecting information, a method of using the memory, and a circuit for comparing memory addresses.

BACKGROUND OF THE INVENTION

Today, vast information is easily utilized in the form of data, but there are still various challenges to be addressed in order to detect and utilize pertinent information. In particular, basic technologies commonly used in information detection such as image recognition, speech recognition, OCR character recognition, full-text search, biometrics authentication with fingerprints and the like, are pattern recognition techniques for detecting or analyzing matching and/or similar information (patterns) among subject information; there techniques have become essential to advanced information processing, and are used in broad applications ranging from, for example, social infrastructure equipment, industrial equipment, factory equipment, digital cameras and home appliances to the latest robots and artificial intelligence.

With this kind of method, the tap remains screwed into the sleeve, so the sleeve must be removed from the tap. However, for example, in the case of grasping the sleeve with a tool such as a pair of pliers and removing the sleeve from the tap by turning the tap, there is a problem in that because the sleeve is extremely thin, there is a possibility that the sleeve may be damaged.

The largest technical challenge of information detection such as pattern recognition is to reduce the number of comparison combinations (the number of searches) while comparing the information. To this end, attempts have been made, for example, to find an optimal algorithm for the subject information in order to reduce the number of comparison combinations (the number of searches), or to utilize a fast computation machine such as a supercomputer in order to find the answer depending on the information contents in question, and in some cases, the detection accuracy was sacrificed.

The present invention relates to Japanese Patent Application No. 2010-33376, entitled "Method of Commonly Managing Information in Information Processing Devices, Method of Detecting Information, Content-Addressable Memory for Performing Global Parallel Comparisons of Data-Address Relative Relationships, and Information Processing Device Comprising a Function to Commonly Manage Information, Software Program and Content-Addressable Memory for Performing Global Parallel Comparisons of Data-Address Relative Relationships" by the present inventor filed by the present applicant on Feb. 18, 2010, which invention provides a memory capable of, and methods of addressing the longstanding challenge of assuring the accuracy of information detection in pattern recognition and information detection technologies as above, while minimizing the number of comparison combinations (the number of searches, the search time). The present application claims a priority of the above patent application.

Japanese Patent Application No. 2010-47215, entitled "Semiconductor Integrated Circuit Provided with Information Refinement Detection Function, and Method of and Device Using said Semiconductor Integrated Circuit" by the present inventor filed by the present applicant on Mar. 4, 2010, regarded the above Japanese Patent Application No. 2010-33376 as an independent invention, changed the expression of the invention name as in "semiconductor integrated circuit provided with information refinement detection function," and disclosed the concept of dual parallel logic operations on match/mismatch determination results, which is the most important feature of the present invention. Also in this patent application, the range of detected information was extended from two-dimensional images to one- or multi-dimensional information. The present application claims a priority of entirety of the above patent application.

The present application has integrated the above two prior patent applications; added mainly to the Application No. 2010-47215, means for reducing the number of information refinement circuits, means for multiplexing the dual parallel logic operations and a method of using the memory, for example, as applied to artificial intelligence; added more descriptions; and changed some expressions.

As described above, there are a wide range of information detection technologies such as pattern recognition and pattern matching; therefore, numerous inventions exist for reducing the search time. However, there is no example of technique or memory found to essentially avoid sequential processing on individual memories, which is destined to happen in the von Neumann-architecture computers, in order to reduce the search time.

For reference, JP-A-H 7-114577, entitled "Data Searching Device, Data Compression Device and Method Using the Same" shows techniques of repetitively searching for information by comparing adjacent data items, whereas the invention of the present application discloses techniques of not only comparing adjacent data items, but also, in all memories, comparing data contents of the data and location relationships between the data addresses in a dual parallel manner.

Next, a memory provided with an information refinement detection function is disclosed in Japanese Patent Application No. 2010-65597, filed by the same applicant and inventor as that of the present application, and this memory allows information search of non-von Neumann architecture since it does not require sequential address processing of the von Neumann architecture, and performs the information refinement by itself in order to search for the information in question.

However, this memory cannot be used in some cases and also information still needs to be searched faster than in conventional information search methods in some other cases. In view of the foregoing technical background, the present application enables an efficient and fast information search using a memory, such as a typical content-addressable memory, capable of comparing data in parallel and outputting addresses as the results.

Although no prior patent application is found to disclose one of the features of the present invention, the parallel comparison of data addresses detected by comparing data in parallel, one prior technology of comparing addresses is found in Japanese Patent No. 3575632, entitled "Computer System and Operation Method for the Same," which relates to pipelined processors, particularly counterflow pipelined processors.

Current typical computer systems are based on an information processing regime (a processor-based architecture) centered literally on the CPU (central processing unit), which has all-purpose information-processing functions.

However, even these CPU's capabilities of all information processing exhibit poor performances when finding a particular piece of information among vast data due to various negative effects generated by the information processing. The present invention has been devised in consideration of this technical background as well.

In information processing, search processing for a desired piece of information among vast data is performed quite frequently, and often users of an information processing device is unaware of the processing running in their devices; for accurate understanding of this search processing, it is essential to correctly understand two steps or concepts in information processing: "information search" and "information detection," which are separately defined in the present invention.

Although these two concepts are not strictly distinguished when it is generally used, the "information search" means an action to look for and retrieve a desired piece of information from some information, whereas the "information detection" means an action to identify a desired piece of information among the retrieved information (including adding meaning to and recognizing the information).

On rare occasions, a desired piece of information may be directly identified without the action to look for it, but in most cases, information is searched by processing that integrates different aspects of the "information search" and the "information detection."

The above information processing may be easily understood with a metaphor of sales activities, wherein the search and detection are compared to visits with many customers (search) and orders received as a result (detection), respectively, and wherein the performance of the sales activities and the information processing largely depend on the visiting activities and the search processing, respectively; while most of the customer visits may be unfruitful, they must be done to receive orders, and likewise, the information detection may not be performed without first conducting the information search As a first example of the above, when a user searches for a desired piece of information from vast information on the Internet, the user provides an information search website with information (typically a vocabulary) as a search key, and an enormous information search engine of the information search website searches through an extensive information summaries (words or sentences) that were collected and accumulated from the Internet by information crawling, and selects and displays/outputs relevant websites, and then users identify and use desired websites from the displayed/output websites; in other words, only the "information search" is automated.

As a second example of the above, when the "information search" is performed for a desired piece of information from, for example, a database in a memory or a hard disk, typically a CPU performs a sequential search for each address, and then executes processing to identify the desired information according to the sequential search results, and finally the desired information is found as the "information detection."

If a CPU with a machine clock of 1 GHz class searches through a memory with 1 GB address space, several seconds are required for simply scanning all addresses of the memory in order to find a desired piece of information, and an additional small fraction of time is needed for identifying (detecting) the desired information among the data found by the scanning.

Therefore, in order to achieve the fast information search detection, the search time is reduced generally by algorithm improvement and parallel processing of the CPU.

In this case, the algorithm improvement refers to an effort to reduce the search time, for example, by limiting the address range which is searched based on characteristics of information array in a storage medium of the memory and characteristics of information being searched; or by improving an information array by limiting the search address range to addresses with a certain condition.

Facial or smile recognition by a digital camera and speech recognition are common examples of the algorithm improvement, and each of these techniques has been developed with labor-intensive efforts by expert engineers over an extended period of time, wherein the accuracy of information detection and the processing time largely depend on a quality of the algorithm, and also pieces of information to be detected is limited to ones which can be detected according to its usage purpose or within a predetermined processing time.

After the algorithm improvement, the search time may be further reduced by dividing the addresses into a plurality of groups and searching them with a plurality of CPU's, respectively, wherein the search time may be reduced generally in proportion to the number of the CPU's.

For example, some of the above-mentioned enormous information search engine of the information search website use tens of thousands of personal computers to reduce the search time, and many supercomputers perform parallel processing using multitudes of CPU's, resulting in larger and more expensive devices.

As explained above, in order to automatically find a desired piece of information among some information, the following two kinds of information processing are essential: the "information search" action to look for and retrieve some information to be searched (sequential processing for each address when performed by a CPU), and the "information detection" action to identify the desired information among the information sequentially processed and retrieved (including the concepts of adding meaning to and recognizing the information).

Analogous to the above metaphor of sales activities and visits with customers, in many cases, most of the searched and retrieved information is irrelevant and truly desired information is extremely limited, rendering the action of information search a heavy burden in the information processing.

This is due to the fact that the CPU is essentially of von-Neumann-processor-based architecture and destined to sequentially search for data address-by-address in the memory, in other words, perform the "information search."

Therefore, what has been long needed in the information processing industry is to provide an information processing system (e.g., memory-based architecture) capable of essentially eliminating the sequential information search, which is inevitable for the von Neumann information processing.

There have been many researches initiated as national projects to address weaknesses (bottlenecks) of processor-based architectures and to develop a memory-based architecture (an information processing system in which the memory plays the main role) such as a neurocomputer as artificial intelligence which imitates a human brain as a memory, but it has been difficult to create general-purpose products and to mass-produce them.

One of the means for realizing this information processing system is disclosed in Japanese Patent Application No. 2010-65597, entitled "Memory Provided with Information Refinement Detection Function," filed by the present applicant and inventor.

Since a memory-based architecture encompasses a wide variety of forms such as the neurocomputer, one of the simplest examples will be described below to facilitate the understanding of the memory provided with the information refinement detection function of the above application, and the memory-based architecture of the present application.

In the following, the memory provided with the information refinement detection function is or may be simply described as an information detection memory.

Here, we attempt to detect some pattern information in weather data of past 100 years in a particular geographical region, wherein each data address chronologically corresponds with each day during the 100 years, and stores the highest air temperature of the respective day. As an example, we consider information search and detection for any day with the highest temperature of 5° C., AND with a particular temperature pattern, wherein the highest temperature on the day before and the day after were 10° C. and 15° C., respectively (although any combination of the day and the temperature, and any number of days may be considered).

The number of addresses for the above temperature pattern data is 365 days*100 years=36 k (36,000), and if the temperature in this geographical region ranges from 0° C. to 36° C., it may be assumed that there are about 10 days/year for each one-centigrade range, in other words, there are about 1 k (1,000) days for each of 5° C., 10° C. and 15° C. temperatures.

As the above-described algorithm improvement, only March through May and October through December may be searched in order to limit the search address ranges as much as possible considering that the temperatures 5° C., 10° C. and 15° C. are not common in January, February and June through September, but these months may also include the temperature pattern due to some abnormal weathers.

Accordingly, there are other reliable ways to search for three consecutive days with the temperatures 5° C., 10° C. and 15° C. in the above order, without relying on any algorithms:
(1) Store the weather data in a typical memory, sequentially search for 5° C. days through the memory using a CPU and compare the temperatures of the days before and after each day found by the search: the number of information processing steps is 36 k (the number of addresses)+α.
(2) Store the weather data in a content-addressable memory, provide the memory with 5° C. as comparison data, sequentially output 5° C. days from the memory and compare the days before and after each of the 5° C. days using a CPU: the number of information processing steps is 1 k (the number of 5° C.-day addresses)+β.
(3) Store the weather data in a information detection memory, provide this memory with both of the temperatures and the relative days (addresses) as comparison data three times and output the 5° C. days from the memory: the number of information processing steps is 3 (comparison processing)+(output processing).

The above (3) utilizing the information detection memory describes the concept of memory-based information processing, which requires no information search and is capable of reducing the number of information processing steps to about oneten-thousandth to thereby allow drastic improvement of the information processing speed.

Although the above is an example of pattern detection of weather data using a memory-based architecture, the number of information processing steps in searching for, for example, identical images or similar images among image data is also typically several times to several tens at most; therefore the memory-based architecture enables various information processing tasks that are impossible with typical processor-based architectures.

It is possible in particular to store program information as data so that a CPU may search though the data to process operations, or to perform information detection on a large database with a integrated information processing using both a CPU (i.e., processor-based information processing) and the memory-based information processing according to the present invention, as discussed in detail below.

As prior art examples of the memory-based information processing, JP-A-2003-036269, entitled "Information Processing Device, Information Processing Method and Memory for Storing a Information Processing Program" proposes an example of a memory-based search engine, and JP-A-2001-229172, entitled "Data Processing Device and Processing System Using Tables" proposes an example of a memory-based data processing device using tables, but neither of these is based on the concepts of the present invention.

Based on the background art described above, the concept to utilize the relationship itself of the data address array as a device for detecting information and the concept itself to actively utilize the relationship of the address array are very unique, and there is no prior technology found based on these concepts.

The objective of the present invention is to ensure or improve information detection accuracy, minimize the number of data comparison steps, and provide an information detection memory of non-von Neumann architecture and a method of using the memory which enable information detection by the memory itself, wherein the information subject to the detection includes information addressed or addressable in one- or multi-dimensional arrays, and wherein the detection is performed with, for example, pattern recognition or knowledge processing by determining sameness or similarity between information subject to the detection (e.g., unknown information) and reference information (e.g., known information) based on conditions of respective relationships among a plurality of data items and among a plurality of addresses of the unknown information and the known information.

Another objective of the present invention is to provide a method of and a circuit for comparing addresses capable of efficient and fast detection of pattern information outside of a memory; and a memory and its device and artificial intelligence capable of parallel comparison of data.

Yet another objective of the present invention is to establish a novel information processing system of memory-based architecture capable of essentially eliminating the concept of information search in information processing; and provide a new-generation information processing system for taking advantage of the processor-based architecture such as a CPU and seamlessly combining the processor-based architecture and the memory-based architecture.

SUMMARY OF THE INVENTION

In order to address the above and other challenges, the present invention provides
an externally readable memory for storing information in each memory address, comprising:
(1) an input means for entering first comparison data for comparing data items stored in the memory and second comparison data for comparing addresses in the memory, wherein the first and second comparison data are externally provided;
(2) means for determining data matches/mismatches by comparing in parallel the data items stored in the memory, with the first comparison data;
(3) means for determining memory address matches/mismatches by comparing in parallel the addresses in the memory, according to the second comparison data; and
(4) a data-and-address dual parallel logic operation means for further performing logic operations in parallel on the match/mismatch results from both of the (2) and (3).

Also in the memory, the means for determining data matches/mismatches of the above (2) and the dual parallel logic operation means of the above (4) may be integrated into means for performing equivalent dual parallel logical product (AND) operations, whose operation results are equivalent to logical products (AND) of the match/mismatch determination results of (2) and (3).

In addition, the memory comprises: a plurality of counter means for counting the results from the means for performing equivalent dual parallel logical product (AND) operations for each comparison for each memory address; means for counting up respective values of the counter means of the memory addresses with matching data to 1, and obtaining the memory addresses with matching data as the first survivor addresses upon the first information detection, wherein the memory addresses with matching data are determined in parallel by a memory data match/mismatch with the first data; means for calculating respective address positional relationships between the memory addresses with matching data which are determined in parallel by the memory data match/mismatch with the first data and the first survivor addresses upon subsequent comparisons, using the means for performing equivalent dual parallel logical product (AND) operations according to the second data, counting up respective values of the counter means of the first survivor addresses and obtaining N-th survivor addresses (here, N is an integer equal to or greater than 2); and means for outputting the N-th survivor addresses.

Also, the means for performing equivalent dual parallel logical product (AND) operations repeatedly performs address swaps (switches) by an address swap (switch) means according to the second data for comparing addresses.

In addition, the second data for comparing addresses uses the first survivor addresses as references, and is one or both of:
(1) comparison data for determining whether or not addresses to be compared match relative addresses, respectively, and
(2) comparison data for determining whether or not addresses to be compared exist within a range to be compared.

Also a structure of the memory is directed to detecting at least one of:
(1) information stored or storable as one-dimensional information such as audio information;
(2) information stored or storable as two-dimensional information such as image information;
(3) information stored or storable as three-dimensional information such as three-dimensional-object information;
(4) information stored or storable as multi-dimensional information such as spatio-temporal information; and
(5) information stored or storable by address group such as clustering information.

Further, the first comparison data for comparing in parallel the data items stored in the memory is comparison data for performing at least one of:
(1) detecting exact matches of memory data items;
(2) detecting value relationships between the memory data items; and
(3) comparing values of individual memory bits including "Don't Care."

Moreover, the first and second comparison data is entered through one or both of:
(1) a data bus; and
(2) a dedicated input.

Also the means for outputting the N-th survivor addresses performs the output through one or both of:
(1) a data bus; and
(2) a dedicated output.

Additionally means for storing the first survivor addresses may be added to the counter means to thereby reduce the number of the counter means down to a number comparable to the number of statistically detected first survivor addresses.

Further, a processor is used for performing functions of the address swap (switch) means.

Furthermore, the dual parallel logic operations are switched and performed for each memory bank.

In addition, the memory comprises a plurality of the input means for entering the first and the second data; and a plurality of the dual parallel logic operation means.

Moreover, the memory is incorporated and used in a semiconductor for other purposes such as a CPU.

Also, the memory detects reference information (known information) and its position by detecting information identical with or similar to the known information from within information subject to the detection (unknown information) according to a condition that a required number of matches occur upon a number of comparisons between a plurality of data items and their respective addresses of the unknown and known information, wherein the known information is provided as the first and the second data, wherein the unknown information is stored in the memory, wherein each of the identical or similar information and its address are detected from within the unknown information by retrieving the N-th survivor addresses.

Also the number of comparisons required for detecting the identical or similar information is equal to or less than the number of samples, wherein the number of samples is determined by extracting from within the reference information (known information) a plurality of samples necessary and sufficient to detect the identical or similar information based on a statistical probability, and obtaining the samples as comparison conditions consisting of the first and the second data.

Further, the samples for detecting information are extracted based on a sample characteristic quantity derived by calculating an absolute value of a data difference between each pair of adjacent samples and totaling all of the absolute values, wherein the sample characteristic quantity is equal to or greater than a threshold value.

Moreover, the address positional relationships are at least one of:
(1) positional relationships among arrayed addresses of information stored as one-dimensional information;
(2) positional relationships among arrayed addresses of information stored as two-dimensional information;
(3) positional relationships among arrayed addresses of information stored as three-dimensional information; and
(4) positional relationships among arrayed addresses of information stored as multi-dimensional information,
wherein these address positional relationships are used to perform pattern recognition.

Also a plural types of samples are used as first comparison samples for determining the first survivor addresses, or a certain range is provided to each of the first comparison samples.

Additionally, the memory provided with the information refinement detection function is used in combination with a CPU capable of accessing the memory, and reading and writing data stored in the memory.

Further, the memory provided with the information refinement detection function stores knowledge information for performing knowledge processing.

In addition, a device may comprise the memory provided with the information refinement detection function.

Also, an artificial intelligence may comprise the memory provided with the information refinement detection function.

Further, the present invention provides a method of using an externally readable memory for storing information in each memory address and capable of comparing the stored data items in parallel, and the method comprises the steps of: determining data matches/mismatches of data items in the memory by comparing in parallel each of the data items with first input data for comparing in parallel the data items in the memory, and outputting and storing the data match/mismatch results for each address, and subsequently determining data matches/mismatches of data items in the memory by comparing in parallel each of the data items with a new set of first input data, outputting and storing the data match/mismatch results for each address, and comparing the data match/mismatch results from both comparisons for each memory address according to second input data for comparing addresses of the memory.

Moreover, the memory addresses with matching data according to the first comparison data are used as reference addresses, and subsequently the first and the second input data are repeatedly provided for performing comparisons between memory addresses according to the reference addresses.

Furthermore, the comparison between addresses is performed in parallel.

Additionally the second input data is relative address data on an information array compared with the first input data.

Also, the above addresses with matching data are compared in parallel, and logical product (AND) operations are performed on the data match/mismatch results for each address.

Moreover, the addresses compared are at least one of:
(1) all addresses;
(2) addresses with matching data for the match/mismatch determination; and
(3) specified addresses.

In addition, the second input data is entered as coordinate data corresponding with the addresses.

Additionally the logical product (AND) operation results for each address are provided to the memory as feedback upon each of the logical product operations in order to refine the number of addresses output from the memory.

Also, the information stored in each of the addresses is pattern information arranged in a one- to multi-dimensional array.

The memory further comprises a circuit for comparing memory addresses (hereafter referred to as "memory-address comparison circuit"), and the memory-address comparison circuit comprises: means for entering data match/mismatch results from a memory for comparing in parallel data items in the memory; means for comparing between and perform logic operations on at least two types of the data match/mismatch results for each address according to the second input data; and means for outputting addresses with positive results of the logic operations.

Also, the memory-address comparison circuit further comprises means for counting the number of matches for each address according to the results of the logic operations.

Further, the memory-address comparison circuit may be incorporated in a circuit for other purposes.

Moreover, the memory-address comparison circuit is a semiconductor integrated circuit.

Also, logic operations of the memory-address comparison circuit are logical product (AND) operations, wherein the memory-address comparison circuit further comprises means for entering addresses with positive results of the logic operations; and means for performing logical product (AND) operations in parallel on addresses with positive results of the logical product (AND) operations and addresses with matching data for the data match/mismatch determination according to the first input data.

Moreover, a device may comprise the memory-address comparison circuit.

Further, an artificial intelligence may comprise the memory-address comparison circuit.

In addition, the present invention provides a method of detecting information using an information detection memory capable of detecting information by itself, wherein desired information is directly detected from the information detection memory by providing the information detection memory with comparison data, and reading addresses and their respective information which are output from the information detection memory, without searching through addresses thereof.

Further, the information detection memory is an externally readable memory for storing information in each memory address, and this memory is a memory-based information detection memory having functions to detect addresses whose data match at least two types of comparison data externally provided, and output the detected addresses.

In addition, the above information detection memory eliminates the need for searching for information both from outside and within inside of the memory.

Moreover, the two types of comparison data are data for comparing data items stored in the information detection memory and data for comparing addresses of the memory.

In this information detection, matching addresses are refined by repeatedly providing the comparison data.

Also, data stored in the information detection memory is arrayed data for defining a relationship between each piece of information and its address in a table.

Further, data defined in a table is at least one of:
(1) one- to multi-dimensional pattern data such as image or audio data;
(2) data for a database such as data for information searches,
(3) data for inferences such as AI (artificial intelligence) inferences, and (4) program data for processor operations such as by a CPU.

In addition, information detections by the information detection memory is performed in combination with information processing by a CPU.

Moreover, the comparison data for one or more of the information detection memory is entered by the CPU.

Also, addresses and their respective information which is output from one or more of the information detection memory is read by the CPU for processing desired information.

In addition, program data for operations which is output from one or more of the information detection memory is ready by the CPU for executing operation processing.

The memory of the present invention may be utilized as a memory having intelligent knowledge, capable of ensuring fast detections and analyses of any information sameness and similarity, and applicable to a broad range of information forecast and advanced knowledge processing; with this memory, a new stream of information processing of full-fledged non-von Neumann architecture may be expected.

The present invention allows fast detections or analyses of sameness and similarity of any information such as pattern information even without the memory provided with the information refinement detection function, and is applicable to a broad range of information forecast and advanced knowledge processing.

Compared with the conventional memory-based architecture which has been studied and developed to date, the memory-based architecture according to the present invention is most valuable in that it may be commonly utilized for any information in any area using any devices readily available for mass production and practical usage.

With the present invention, any information may be subject to detections including one- to multi-dimensional pattern information as well as various database information, Web information and program data without any particular expertise, allowing anyone to easily utilize this device; therefore, the present invention may release users from the time-consuming information search during information processing, permit information detections in countless fields, for example, ultrafast information detection sensors and databases and even applications in advanced artificial intelligences, where no conventional information detection has been possible.

As discussed above, CPU's have information processing functions usable for any purposes and improvements of their speed and functionality have been directly linked to the evolution of information processing, but now with limitations of the CPU speed becoming apparent, a novel information processing system may be implemented with devices taking advantage of CPU's and memories as well as the novel memory-based architecture of the present invention to thereby drastically accelerate the speed and advancement of information processing.

The above and other characteristics and marked effects of the present invention will be readily appreciated by those skilled in the art by referring to the following Detailed Description of the Preferred Embodiments and the accompanying drawings.

BRIEF DESCRIPTION OF THE DRAWINGS

FIG. 9 depicts a third analogous example of an address swap;

DETAILED DESCRIPTION OF THE INVENTION

Figure 1:
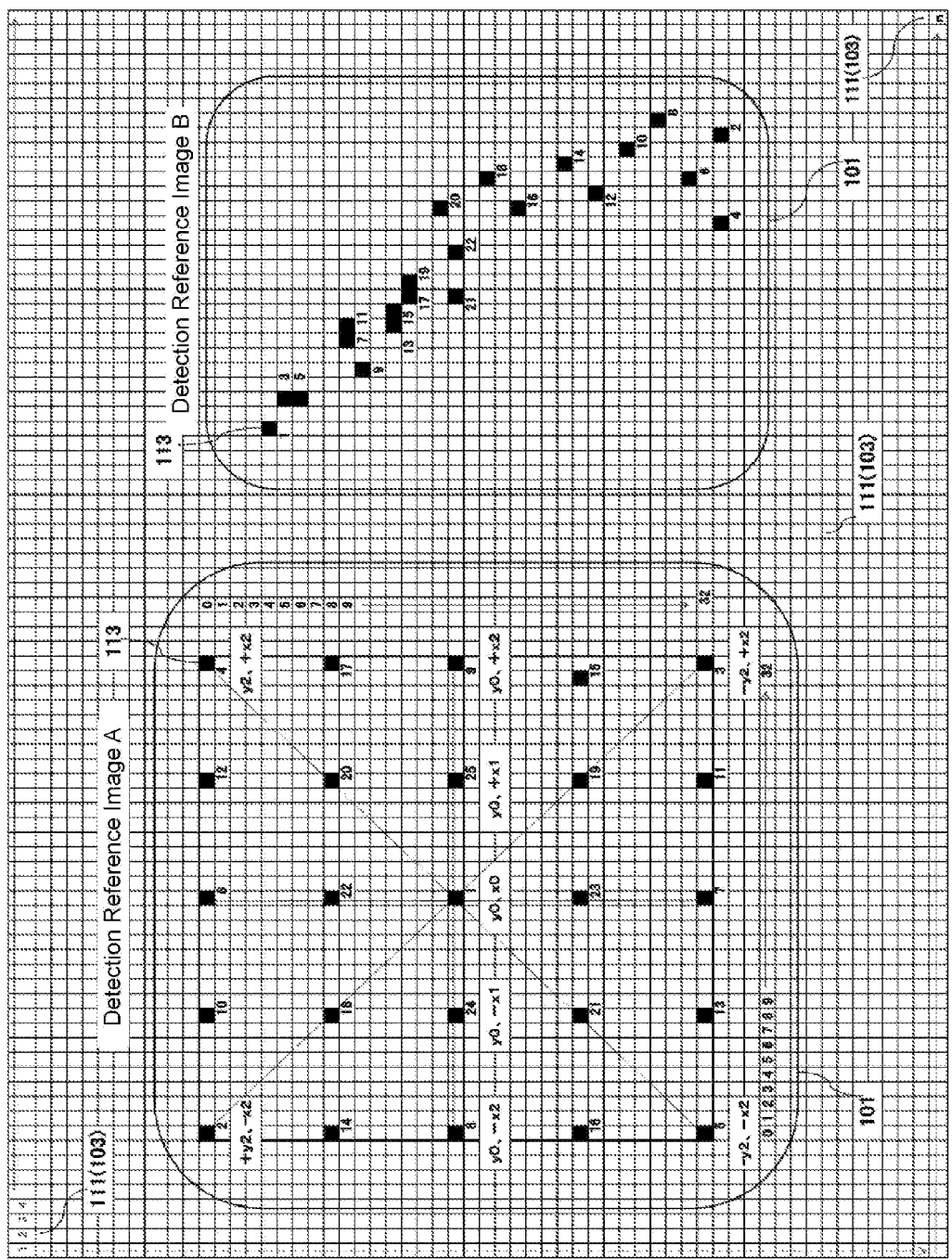
FIG. 1 depicts an example of sampling points (Embodiment Example 1)

First, a concept of information detection of the present invention will be described with an example of an image, which is two-dimensional information.

Typically, in order to detect sameness between an image subject to detection (unknown information 102) and an image used as reference (known information 101), basically all unknown image data subject to detection are searched through based on some image information obtained from the image used as reference (known information 101), and each image coordinate needs to be searched to improve accuracy of the detection.

For example, in order to search for a particular data from an image displayed on a personal computer or a digital television screen, about 2 million pixels of the screen are subject to the search. In this case, if a CPU is to perform a simple search by first expanding bitmap data of the entire screen from a graphic memory to a memory for the search, then searching for the particular data through the entirety of the temporarily expanded data at a rate of 50 nano seconds (ns) per pixel on average, the time required for the first-time search through the entire graphic (full screen) range is 2 million*50 ns=100 ms. Typically, the search time decreases from the second-time because the subject of the search is narrowed down, but it still takes several hundred ms to identify a desired image; therefore in order to search for many images on one screen, the search time will not be negligible no matter how fast the CPU performs its processing.

The above is an example in which the CPU searches for a strictly identical image, but in order to also search for the desired image in different sizes and rotation angles, the CPU has to repeat coordinate-conversion operations and the processing time may increase several hundred- to several thousand-fold, rendering such a search unfeasible. This is inevitable in information detections by any von Neumann-architecture computer which requires its CPU to sequentially search through each memory address.

Due to the above technical background regarding the search time, current searches mainly extract image characteristics, cluster the characteristic data and search for similarities between images using the clustered characteristic data to thereby be extensively utilized in the facial or smile recognition in digital cameras, speech recognition or the like. However, search performance such as detection accuracy, search time or searchable information largely depends on techniques of extracting characteristics, clustering and the like. Also in image search applications, the rate of false identification is often fatal and the sameness search is needed more than the similarity search in many cases.

As described above, there is a tradeoff between the image search reliability and the search time reduction, and first, the reliable detection of an identical image in the image search will be discussed below.

As has been noted, the present invention essentially detects information on each coordinate (address). Also, the types of information and respective resolution are essential in order to achieve the desired reliability as described below.

There are a variety of image information types, but mainly two types of image information will be discussed here.

A first type is data from a frame buffer (graphic memory) of a displayed image and this type of data typically has a data depth of about 8 bits to 16 bits for each of R, G and B information in the case of a color image. Although the R, G and B color signals can be used "as is," as one example of effective image detection, images with any colors may be detected accurately by obtaining 4 bits from each of the R, G and B signals as a data for each pixel (combination of 3 sets of 16 possibilities) from about 2 million pixels in a frame buffer of a personal computer or an image/video device. In this case, the number of color combinations for 12 bits is 4096, and if there are various colors across the screen, the number of pixels with one particular color on the screen may be estimated as 2 million/4096=488 pixels (addresses).

As a second type, for example, in JPEG (Joint Photographic Experts Group), MPEG (Moving Picture Experts Group) or many other compressed image data formats, it is possible to regard one block (e.g., 8 pixels×8 pixels) as one coordinate, and DC (direct current) component data of the DCT (discrete cosine transform) of brightness or color-difference signals for each block may be used as its coordinate data "as is". Also, other information such as vector information may also be used. Since this DCT is for each block, the number of coordinates (addresses) may be significantly reduced (e.g., to 1/64) compared to the pixel-by-pixel case.

Needless to say, the higher the resolution is, the more desirable in either case, but since higher resolution requires more memory capacity, a number of required bits may be selected from the LSB side, considering the above quantized data as the image data. In the following, an example of image detection will be described in reference to the above-described pixels; i.e., image information in 2 million 12-bit pixels (addresses) with the 4096 possible R, G and B signal combinations as image data.

Embodiment Example 1

FIG. 1 (sampling-point example) depicts sampling points 113 of an image as a detection reference (e.g., known information 101) and n pixels 111, i.e., 1, 2, 3, 4, . . . , n from the upper-left corner to the lower-right corner of a screen, whose data is stored in the same order in memory addresses 103, i.e., 1, 2, 3, 4, . . . , n.

A detection reference image A is directed to relatively a small-size image and has its center coordinate (y0, x0) and surrounding 24 coordinates which are automatically arranged with equal spacing as sampling points 113, and makes up 25 sampling points 113 in total on an area of this detection reference image (e.g., known information 101), wherein this area covers 33 pixels in the X- and Y-axes, respectively, that is 1089 pixels in total. However, the size of the detection reference image may be larger than this example.

In this example, the numbers from 1 to 25 in FIG. 1 indicate a sample comparison order, wherein the center is the base point and the subsequent points are detected starting from the sampling points 113 away from the center to the sampling points 113 closer to the center in a diagonal order, but the arrangement and the comparison order are not limited by this example as described in greater detail below.

A detection reference image B is an example where its sampling points 113 from 1 to 22 are manually configured corresponding with this detection reference image and spacing between these points are not equal. A method of manually setting the sampling points 113 for detection as in this example utilizes advantageous ability of human to recognize characteristics, and is effective when pixels are differentiated using specified characteristic points and characteristic ranges.

Thus for reliable image detection, each coordinate as a unit of detection may be specified as a sample point and this ability to perform detection coordinate-by-coordinate is one of characteristics of the present method that may not be achieved by other search and detection methods, which often take a certain area that includes some pixels as a characteristic sample.

Embodiment Example 2

Figure 2:
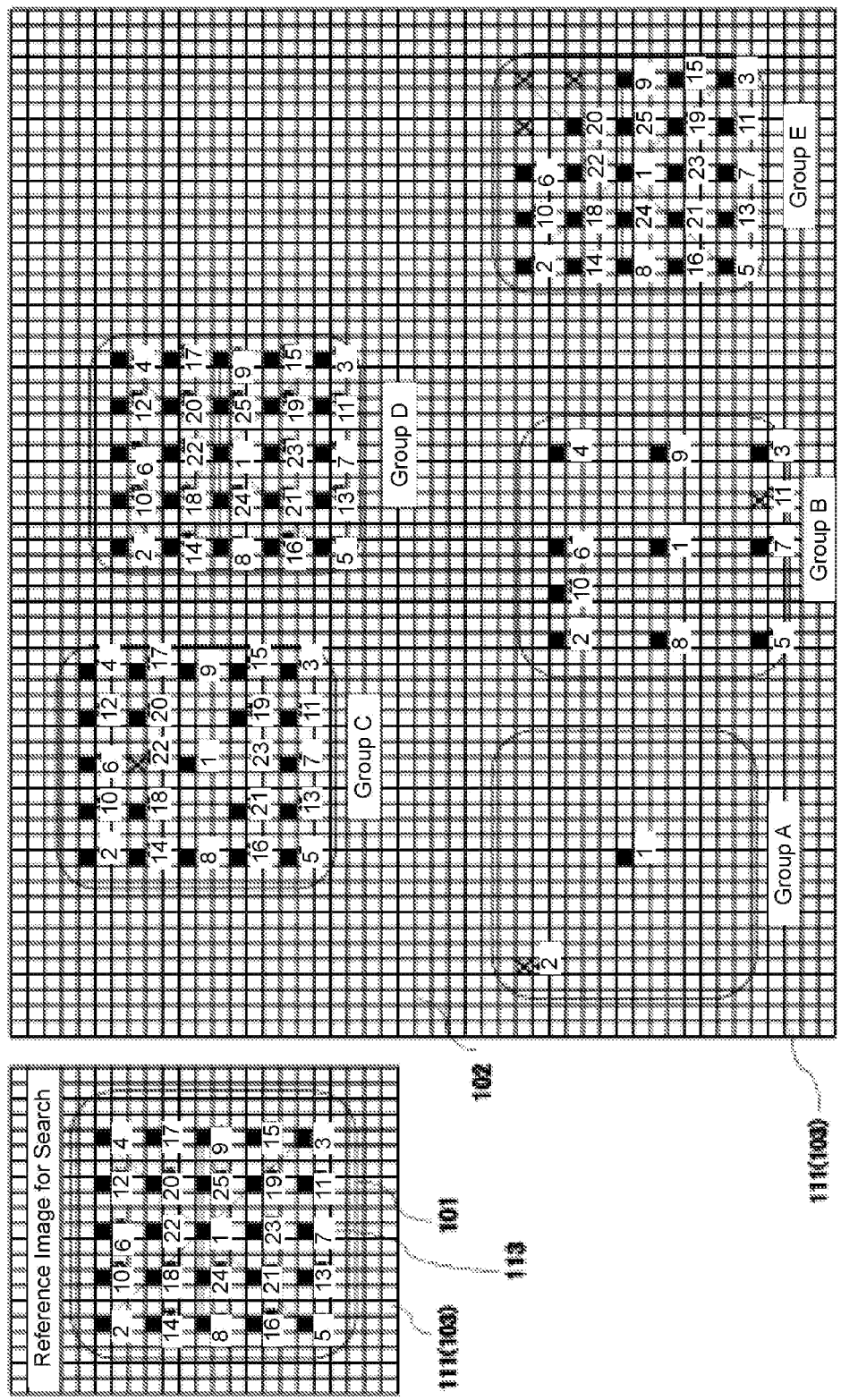
FIG. 2 depicts an embodiment example of information detection using sampling points (Embodiment Example 2)

FIG. 2 (embodiment example of information detection using sampling points) depicts image detection examples using the detection reference image A of FIG. 1 as a reference image. FIG. 2 depicts an image as a detection reference (e.g., known information 101) and images which are subject to search (e.g., unknown information 102).

In this figure, the group A of the unknown information 102 is an example which had a match in a first comparison but had no match and rejected in a second comparison; the group B and the group C were rejected in a eleventh and a twenty-second comparisons, respectively; and the group D had matches for all of its sampling points. In these searches, the above-described coordinate data for each address may be simply read and compared with that of the detection reference image.

In this figure, although the groups A to E are depicted as completely separated from one another in an image area, the above technique works if relative location relationship is correctly compared even for a typical image where particularly one with a low resolution or having adjacent or concentrated coordinates with identical data.

In this case, statistically the group D may be determined to be identical with the reference image, but this method is optimal in detecting relatively small-size images because this method can ensure detection of only identical images, but not similar images, by verifying the match of not only the sampling points 113, but also all other pixels of images compared with each other.

The above verification method may also be taken advantage of to allow determination of a partially matching image such as the group E, a few of whose sampling points 113, which are close with one another, do not match with those of the reference image, wherein matching part of the image may be determined as a variant image partly changed from the matching image. Also an image such as the group C may be determined as a similar image. These details are as discussed below.

The above-described method first takes a coordinate of selected sampling points 113 as a reference, determines relative positions of coordinates of the remaining sampling points 113 against the reference coordinate and selects coordinates that are in agreement with reference relative positions as candidate coordinates. The objective of the present invention is to provide a method of and device for performing such combinatory searches and ultrafast image (information) detection as described in greater detail below.

In the above-described image detection method, selection of the sampling points 113 is particularly important for which there are two factors: how to choose a certain range of image data and a degree of change in the image data. For example, image detection is difficult for an image which has only a black or white part with no change; that with small changes; or less-significant characteristics constructed only by characters or the like.

In the following, sampling points 113 which are strongly related to effectiveness and reliability of image detection will be discussed.

When one coordinate on an image is selected as a reference, any adjacent coordinate has a high probability or correlation to be determined identical or approximate quantized data of the reference coordinate; and this probability or correlation decreases for coordinates away from the reference; therefore, sequential verification starting from distant sampling points 113, as shown in the samples in FIG. 1, has a higher probability in determining matches and mismatches, and allows fast and efficient detection.

Accordingly, when all of the fully distributed sampling points 113 are used, the probability for an identical group of coordinates to exist is determined by an exponent of 2, whose exponent index is determined by multiplying the number of data bits per sampling point 113 and the number of the sampling points 113.

For example, when each coordinate has 4 bits for each of R, G and B as described above, the number of bit value combinations is 212 per coordinate, and if there are ten sampling points 113, the number of combinations for all ten coordinates is 2120; this becomes practically an infinite number. Therefore, if all of the sampling points 113 match, the compared images may be considered identical unless two compared images are monotonous with non-significant characteristics.

However, the fully distributed sampling points 113 as above may not be employed for, for example, an image in a limited and narrow range or a black and white image with characters or the like.

Accordingly, the effectiveness of the sampling points 113 in image identification may be evaluated, as described below, and appropriate measures may be taken by, for example, activating an alarm, extending an image area for detection or adding sampling points 113, if necessary.

Embodiment Example 3

Figure 3:
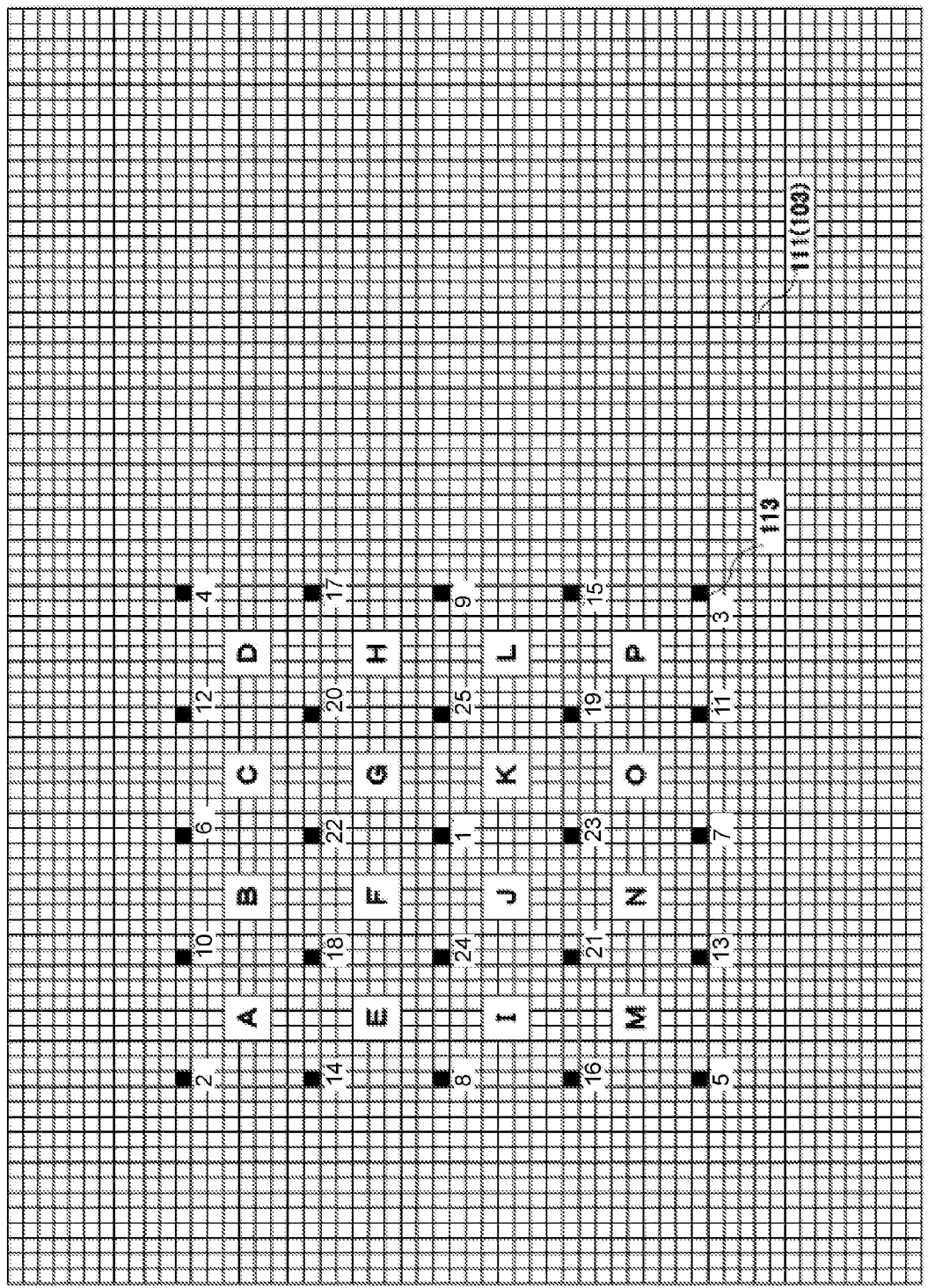
FIG. 3 depicts an example method of evaluating sampling points (Embodiment Example 3)

FIG. 3 (an example method of evaluating sampling points) illustrates an evaluation of effectiveness of the sampling points 113 in image identification using the detection reference image A of FIG. 1, depicting 16 groups, i.e., groups A to P each consisting of four adjacent sampling points 113, taken from the 25 sampling points 113 from the coordinate 1 as a detection reference coordinate to the last coordinate 25.

For example, the group A includes four sampling points 113, i.e., 2, 10, 14 and 18, the group B includes different four sampling points 113, i.e., 10, 6, 18 and 22 and so forth.

In this case, since differences of data such as brightness or color information among intra-group coordinates are related with the magnitude of characteristics, in other words, the magnitude of a sample characteristic quantity, the characteristic quantity for each group may be obtained by calculating the absolute value of data differences between two intra-group sample points for six combinations of two out of the respective four sampling points 113 of the group A to P, for example, 2-10, 2-14, 2-18, 10-14, 10-18 and 14-18 for the group A, and totaling the differences of these six combinations; and likewise the characteristic quantity for the entire 16 groups may be obtained by summing the respective total differences of the 16 groups.

For the present case of R, G and B data, the above evaluation may be performed for each of these color data.

Also the image identification effectiveness may be compared among groups each of which has the same number of sampling points by summing the characteristic quantities for the groups A to P and dividing the total characteristic quantity by the number of groups, i.e., 16 to thereby derive an average characteristic quantity as a measure of characteristic quantity.

It is to be understood that smaller sample characteristic quantities compromise the image identification effectiveness of the sampling points 113; therefore, an adjustment may be needed for a case of small sample characteristic quantities by, for example, increasing the number of sampling points 113 or extending the image area so that the image identification effectiveness is equal to or greater than a threshold value when a detection reference image and its image area are specified. Conversely, this method of evaluating the sampling points 113 is important in order to maintain the reasonable number of search processing steps (search time) for images. This method is also effective when the sampling points 113 are determined manually.

The present example evaluates the identification effectiveness using the characteristic quantity of two-dimensional information, but may be analogously extended to adjacent samples and their data differences in one- to multi-dimensional information. Moreover, depending on information subject to detection, the effectiveness of the information detection may be further ensured by uniquely determining a sample reference based on the information characteristics.

The information detection with reliability crucial to implementation of the present invention has been described above in conjunction with two-dimensional information, but basis of this concept is applicable to information of other number of dimensions.

Here, an array of information stored in a memory for implementing the present invention will be discussed.

One-dimensional information refers to information that is sequentially stored in one-dimensional memory addresses; two-dimensional information refers to information that is, or may be, stored in a two-dimensional table whose size is determined by two maximum numbers of coordinates in respective two dimensions, wherein the information in one-dimensional array of memory addresses, such as the addresses 103 from 1 to n in FIG. 1, is sequentially stored row by row in the table, and wherein the configuration of the memory including the data size and the capacity is determined according to each particular application.

Similarly, three- or multi-dimensional information refers to information that is stored in a three- or multi-dimensional table whose size is determined by a maximum number of coordinates in each of its dimensions, and the memory configuration is also determined according to each particular application.

Accordingly, for one- to multi-dimensional information stored as above, a specific address is identified if a specific coordinate is given for each dimension which has its maximum number of coordinates; therefore, a relative location and a range of coordinates may be identified. Needless to say, if any address is directly identifiable even in multi-dimensional information, the identified address or a relative address may be directly specified. The foregoing description is to explain a typical method of address/information arrangement, and this typical method of basic information arrangement is also the method of information arrangement for implementing the present invention so that it is extremely easy to apply to typical memories.

In the following, an adaptation of a memory 121 to a content-addressable memory will be discussed, and this memory 121 is provided with information refinement detection function of the present invention based on the concepts explained above.

Content-addressable memories are used as memories such as cache memories or communication data processing memories which are particularly important among information processing devices and required to perform fast processing. Also for image data in particular, content-addressable memories are actively studied as searching device for detecting similar images with the shortest distance search (similarity distance search) for searching similar images using the cluster analysis.

Overview of content-addressable memories will be discussed below. In addition to providing typical memory functions, content-addressable memories used for fast data processing may provide the entire memories with external comparison-reference data simultaneously (in parallel) and make it possible to read addresses of memories which meet a certain criterion to thereby offer high convenience for information searches.

Analogous to this parallel processing, we may consider an example where many people are in an assembly hall, where each of them is sitting in a chair (an address) and is told to freely choose a card of his/her favorite color (data). For example, when looking for people with a read card (data), if it is a normal memory, one may need to check with everyone in the hall sequentially in the order of chair arrangement or the like. In contrast, if it is a content-addressable memory, one may simply ask people with the red card to raise their hand (parallel comparison) and checks (outputs) their seats (addresses), thus making this determination extremely fast. In this way, the content-addressable memory is a device which compares vast information in parallel and can conveniently find only required data.

Having various benefits, content-addressable memories also have one structural weakness: in the case of a memory device which reads and writes data using a data bus and an address bus, although the device may determine the match or mismatch simultaneously in response to externally provided data as a comparison reference (in the present example, the color red), if there are a plurality of matching addresses, it cannot output all of them at once.

In order to resolve this challenge, one may provide the device with an output priority function so that the device can output the matching addresses sequentially according to any given priority, but unless the number of matches is small enough, it will take a long time to read all of the matching addresses. Generally the matching addresses are read out and the memory is provided with another comparison condition according to which sequential processing is performed to refine the search results.

In the above case of an image, when each of the 2 million pixels (addresses) has 12 bits of color data with 4096 data combinations from which only one combination (color) is searched, the sequential and conditional comparisons must be repeated on an average of 488 addresses and most of the 488 addresses may become mismatch pixels (discards in search refinement) and time spent to process these refinement will be wasted; the same may be said about three- and higher dimensional information as well.

Accordingly the objective of the memory 121 equipped with the information refinement detection function of the present invention is to provide a memory capable of dual parallel match/mismatch determination for reducing or eliminating the number of sequential processing steps using a function to request people to raise their hand if they have the red card and if their seat relationships (address relationships) match a certain criterion (e.g., adjacent people, or people in front and back and on the left and right also have the red card), in other words, a function to provide the entire memory (people in the seats) with a relationship between data and its address, i.e., a comparison condition (a color of the card and a relative relationship of the seats) every time a search is conducted to thereby refine the results of parallel match/mismatch determination and output the matching addresses which pass a logical product (AND) operation test (an address which has the red card and whose front, back, left or right address has the read card), which meet both criteria on the stored data (the color of the card) and the address location (the relative relationship of the seats); another objective of the memory 121 is to provide a memory capable of various dual parallel logic operations.

Figure 4:
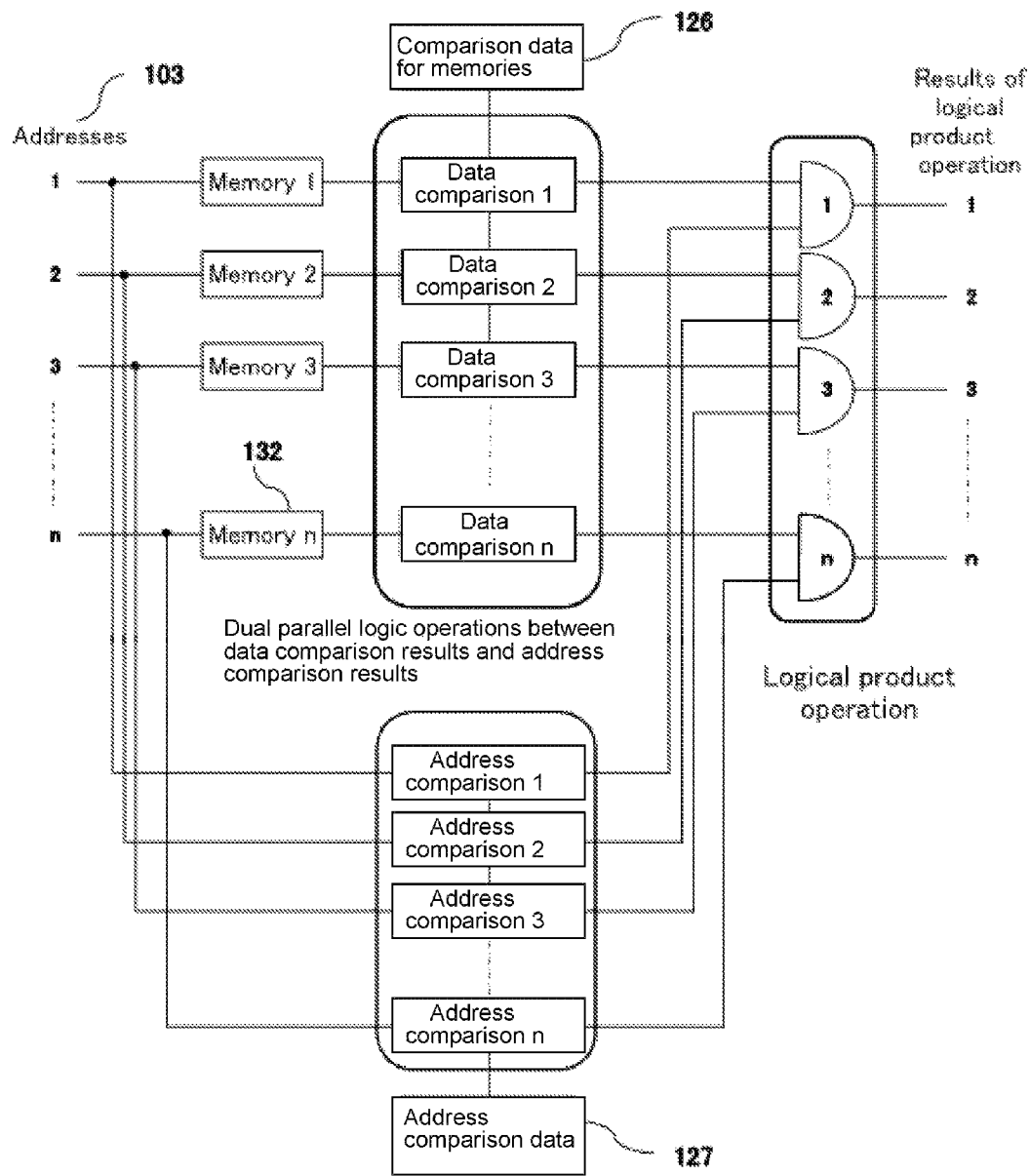
FIG. 4 depicts an example concept of dual parallel logic operations on data and addresses.

FIG. 4 (a concept of dual parallel logic operations on data and addresses) depicts a concept of the logical product (AND) operation as a result of the dual parallel match/mismatch determination on data and addresses of memories described above. In this figure, a comparison of data contents in respective addresses and a comparison of respective addresses are performed in parallel (dual parallel) onto which results the logical product (AND) operation is performed in parallel in order to refine the information. The results of this operation may be utilized in any manner.

The above refinement is quite effective even with only one-time execution, but an ideal information refinement detection will be possible if these dual parallel logic operations are performed repeatedly and consecutively.

In implementation of the above concept, it may be easy to depict an address match/mismatch determination circuit for comparing addresses as a concept as shown in the lower part of FIG. 4, but it is difficult to actually embody this concept as a logic circuit since how to do the address comparison and which addresses should be compared cannot be determined based on known technologies.

For example, one possible method may use each of the addresses that survived the first comparison (first survivor addresses) as a reference compared with other addresses. However, in this method, a circuit for comparing each address combination in parallel would be extremely large-scale if we assume there are 488 first survivor addresses and each of these has to be compared to each of the remaining addresses.

This address comparison circuit may be feasible for a small number of memory addresses, but in order to implement the logic structure of FIG. 4 in as a simple circuit structure as possible, the present embodiment derives an optimal solution to this logic circuit by defining the first survivor addresses as reference origins for subsequent comparisons and focusing on the fact that the relative locations (addresses) of the relative addresses (coordinates), which are compared with the reference origins, seen from the first survivor addresses (coordinates) are the same at each of the subsequent comparisons.

Specifically, the first survivor addresses may be considered as the reference origin coordinates for each of the above-described sampling points 113 shown in FIG. 1, a certain relative bias or range may be set as the addresses 103 to be compared, a match or mismatch may be checked at each of the addresses 103 for each of the first survivor addresses, and the first survivor addresses with matching addresses 103 may be considered "winners."

The above can be done because each data item in the memory is stored in a one-dimensional array of addresses with a relative regularity.

As discussed below, the above argument is universal for not only one-dimensional information, but also two- or higher dimensional information and general databases, in which relative locations among addresses are specifiable, making this concept applicable to extremely wide range of information detection.

Further, a counter may be provided for each of the addresses 103 for recording the number of times each of the addresses 103 has passed (survived) comparisons so that the number of survival times may be accumulated for each of the first survivor addresses as reference origins, and first survivor addresses with the highest number of survival times (N times) may be determined as N-th survivor addresses to thereby enable a logic circuit for consecutive refinement, which may be quite simple, yet capable of satisfying all of initial objectives to implement a device which overcomes one of the longstanding challenges of information processing.

As described below, the dual parallel logic operations of FIG. 4 are not limited only to the logical product (AND) operations, and the results of the dual parallel logic operations may be utilized in any manners.

Also the refinement results (winners) may be recorded without counting the number of matches (survival times).

Embodiment Example 4

Figure 5:
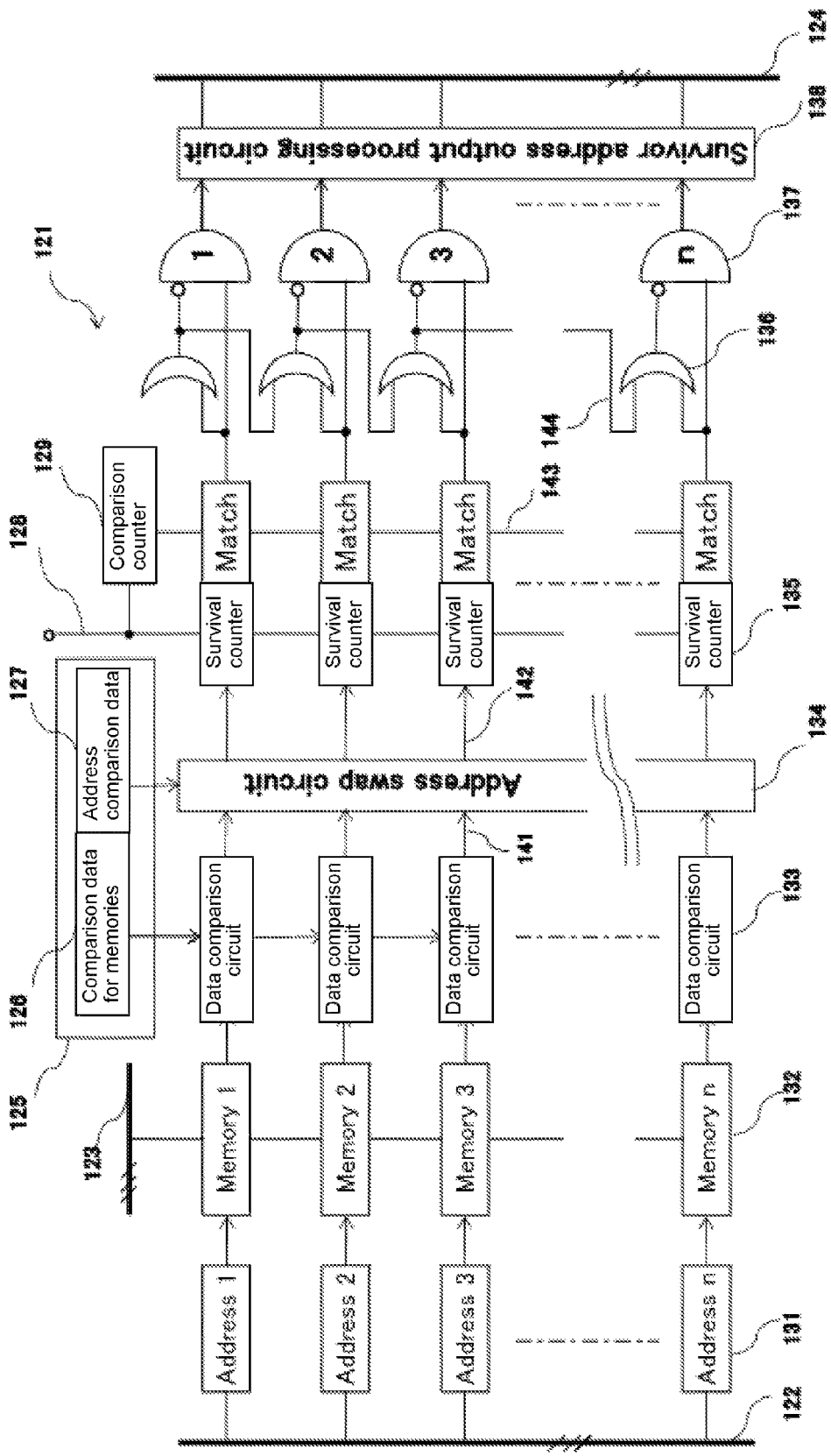
FIG. 5 depicts an example memory provided with an information refinement detection function (Embodiment Example 4)

FIG. 5 (a memory example provided with an information refinement detection function) depicts a functional overview of the memory 121, which is an embodiment of the present invention described above, based on the content-addressable memory, wherein details such as timing of data processing are omitted in order to clearly explain a concept related to the present invention.

The memory 121 provided with the information refinement detection function of this embodiment (hereinafter, referred to also as a "memory of the present invention") is connected with an address bus 122 and a data bus 123 so that the memory 121 can send and receive data with external elements.

Accordingly, data stored in memories 132 having memories 1 to n may be read and write through the data bus 123, and address decoders 131 of the address bus 122 selects one or some of the addresses as addresses readable or writable.

Input data 125 provides the memory 121 of the present invention with data for detecting information. Memory comparison data 126 is included in the input data 125 and is first data externally provided for data comparison, wherein the comparison between the data 125 and the data in the memories 1 to n of the memories 132 are determined by data comparison circuits 133, respectively, and match results are output as pre-address-swap match outputs 141.

Address comparison data 127, which is second input data 125, and an address swap circuit 134 will be discussed below.

Each of counters for the number of survival times 135 (number-of-survivals counters 135) accumulates the number of matches in each of the data comparison circuits 133, respectively, as the number of survival times according to post-address-swap match outputs 142, and stores the cumulative number, wherein each of the number-of-survivals counters 135 has a function to output a match signal which indicates a match between its internal number of survival times and number of comparisons indicated by a number-of-comparisons signal 143 from a counter 129 (number-of-comparisons counter 129) for counting the number of information comparisons, which counts the number of times information has been compared, wherein the output (match signal) from each of the number-of-survivals counters 135 is sent to a corresponding OR gate 136 and inhibit gate 137, and wherein one smallest address among addresses of the number-of-survivals counters 135 with N-times of survival is preferentially selected as a signal sequentially sent down a cascade connection 144. It should be noted that a reference numeral 128 indicates a reset signal.

A survivor address output processing circuit 138 passes the address with high priority onto an output bus 124, clears the number-of-survivals counters 135 which have completed their output processing, and selects subsequent addresses with N times of survival so that they will be output with high priority next and sequentially output by the output bus 124. Above dedicated output embodiment of dedicated bus output is only an example and the output of results may also be directly passed onto the data bus 123. Therefore, according to this structure, addresses (coordinates) with the highest number of survival times (N times) in the number-of-survivals counters 135 are the winners (N-th survivor addresses) and these addresses are output in ascending order.

Embodiment Example 5

Figure 6:
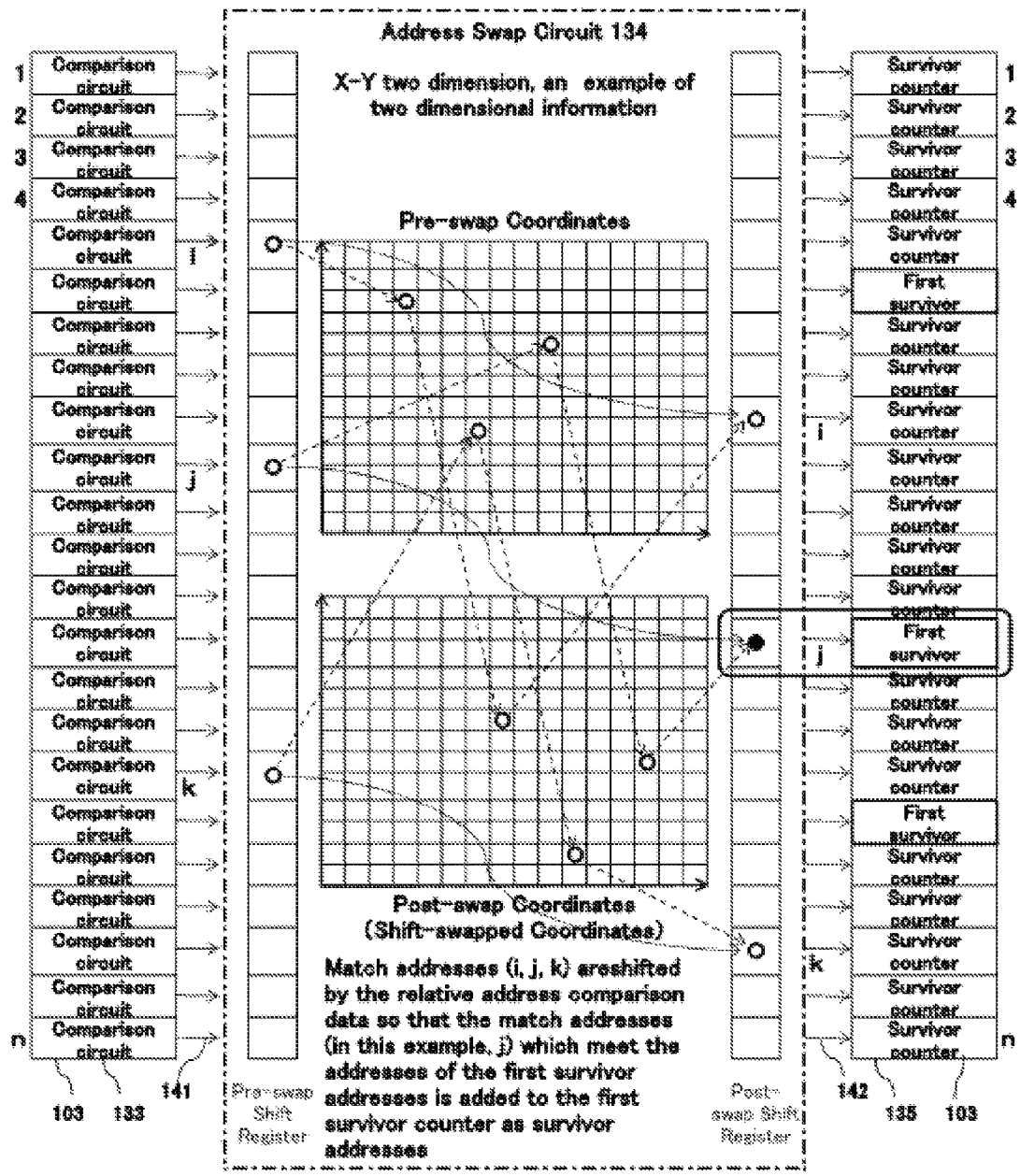
FIG. 6 depicts a first example of an address swap circuit (Embodiment Example 5)

FIG. 6 (a first example of an address swap circuit) illustrates an extremely simple structure of a logic circuit and a basic concept of the address swap circuit 134 as means for implementing the present invention.

The address swap circuit 134 is provided between the data comparison circuits 133 and the number-of-survivals counters 135, and accumulates the number of survival times for the first survivor addresses as a result of dual parallel logical product (AND) operations every time the samples are compared. In this example, the address swap circuit 134 is configured to convert the pre-address-swap match outputs 141, i.e., i, j and k in FIG. 6, into x and y coordinate data using the relative address comparison date of the address comparison data 127, which is the second input data 125 as described above, shift the converted match output based on the relative addresses, obtain the post-address-swap match outputs 142, and enter the post-address-swap match outputs 142 as survival outputs in the number-of-survivals counters 135 of applicable addresses (the first survivor addresses).

In other words, the post-address-swap match outputs 142 are entered as survival outputs in the number-of-survivals counters 135 of the first survivor addresses if the post-address-swap match outputs 142 meet the relative address conditions of the first survivor addresses.

Needless to say, instead of using the coordinate data, the relative address comparison data may be directly specified as the relative addresses so that the shifting operation may be directly performed using the relative addresses.

The above-described first and second input data may be entered via the data bus 123 or a dedicated input. In the following, an example of image detection will be explained where the memory 121 stores the above-described pixel data of an image or equivalent information and the image is detected from unknown information 102.

In the memories 1 to n of the memory 132 of FIG. 5, each pixel data item is written in an address corresponding to each coordinate, whereas the number-of-comparisons counter 129 and the number-of-survivals counters 135 are all initially cleared with a value 0 and the number-of-comparisons counter 129 will have an accumulated value each time a comparison is made.

First, as a first comparison, pixel data of a sample 1 is provided as the memory comparison data 126 of the input data 125, match or mismatch is determined in parallel for all memories, the pre-address-swap match outputs 141 are provided from the data comparison circuits 133 as first match outputs, the first match outputs are entered to the number-of-survivals counters 135 as post-address-swap match outputs 142 with no address-swapping, and the values in the number-of-survivals counters 135 of survivor addresses (i.e., first survivor addresses) are increased to 1, respectively. Thus, no second data is necessary for the first comparison.

As discussed above, an average number of first survivor addresses (i, j and k in FIG. 6) is 488. This number is only illustrative to facilitate the understanding of the present embodiment and may be more or less than 488. It is also said in the following.

In FIG. 2, the memory addresses having the value 1 in their respective number-of-survivals counters 135, therefore being the winners (first survivor addresses) are five addresses which are numbered 1 in the groups A, B, C, D and E, respectively, and these five addresses (coordinates) will be of importance in the following.

Next, pixel data of the sample 2 is specified as the memory comparison data 126 and other 488 addresses on average are selected as second match outputs.

Further, a difference between the match addresses according to samples 1 and 2 is specified as relative address comparison data of the address comparison data 127; addresses which match the relative relationship with the first survivor addresses among the newly selected 488 addresses, in other words, a group of addresses which meet the relationship specified as the relative address comparison data are added as survival outpouts in the number-of survivals counters 135. In FIG. 6, the newly selected 488 addresses are shifted by an address (a coordinate) equivalent to the difference specified as the relative address comparison data by the address swap circuit 134, and the post-address-swap match outputs 142 are added as survival outputs in the number-of-survivals counters 135 at the shifted relative positions (at the positions of first survivor addresses).

Normally in the conventional techniques, values are added in number-of-survivals counters 135 of the coordinates (addresses) 2 of the groups A-E of FIG. 2, but in the present embodiment, values are added as second survival outputs in number-of-survivals counters 135 of the addresses (candidate coordinates) that survived the sample 1 comparison determination (first survivor addresses) so that second survival outputs are continuously added to the first survivor addresses.

In FIG. 2, first survivor addresses with a value 2 in their number-of-survivals counters 135 are four addresses 1 of the groups B, C, D and E, respectively, which are coordinates maintained as candidates, whereas the address 1 of the group A does not remain as a candidate since its number-of-survivals counters 135 does not receive the second survival output.

The above is equivalent with the case where it is determined whether or not memory address positions in question (address positions corresponding to the second sample) exist at intended positions derived from the first survivor addresses (relative address comparison data), and logical products (AND) of matching addresses based on first and second data comparisons are calculated, results of which are entered as survival outputs to the number-of-survivals counters 135 of the first survivor addresses.

Similarly, data comparison results of the memories 132 and relative addresses for other samples relative to the addresses of the sample 1 as the first comparison are read as respective pairs of input data 125 in a sequential order, and survivor memories among each match address group are cumulatively counted in the first survivor addresses to thereby enable continuous refinements of the first survivor addresses (winner candidates).

Thus, an only first survivor address which survives through the last sample 25 (N=25) in FIG. 2 is the coordinate 1 of the group D (25th winner), wherein the number-of-survivals counter 135 of this coordinate (address) has a value 25, and wherein this value 25 coincides with the number-of-comparisons signal 143 of the number-of-comparisons counter 129 and will be output from the number-of-comparisons counter 129 into the subsequent OR gates 136 and the inhibit gates 137.

Figure 7:
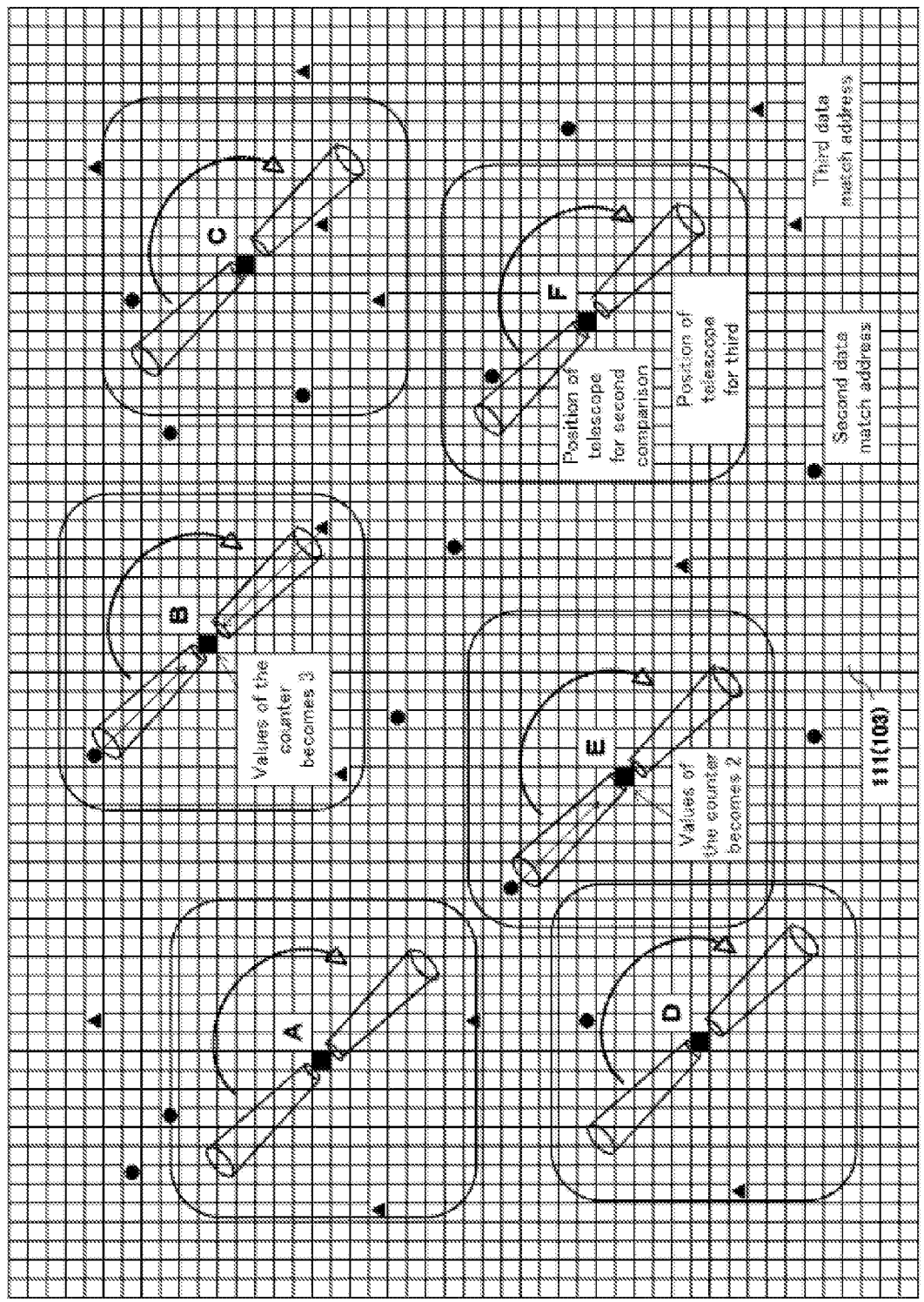
FIG. 7 depicts a first analogous example of an address swap.

FIG. 7 (a first analogous example of an address swap) depicts a match of both data and relative relationships of addresses described above, in other words, a successful result (survival) of the dual parallel logical product operation. As shown in this figure, there are six first survivor addresses A-F in a screen after an first comparison.

In this address swap, which will be performed to all addresses in this screen, one may imagine that each of the first survivor addresses A-F looks into a telescope at a respective relative coordinate position for the second comparison within the respective address groups, and if there is a match output for a second matching address (indicated by small solid-black circles), captures it as a survival output; this is the very image of the address swap.

Similarly in a third comparison, the first survivor addresses A-F each looks into a telescope at a different relative coordinate position, respectively, and captures a match output for a third matching address (indicated by small solid-black triangles), if any, as a survival output; and so on. In the present example, counter values for E and B are updated to 2 and 3, respectively.

Figure 8:
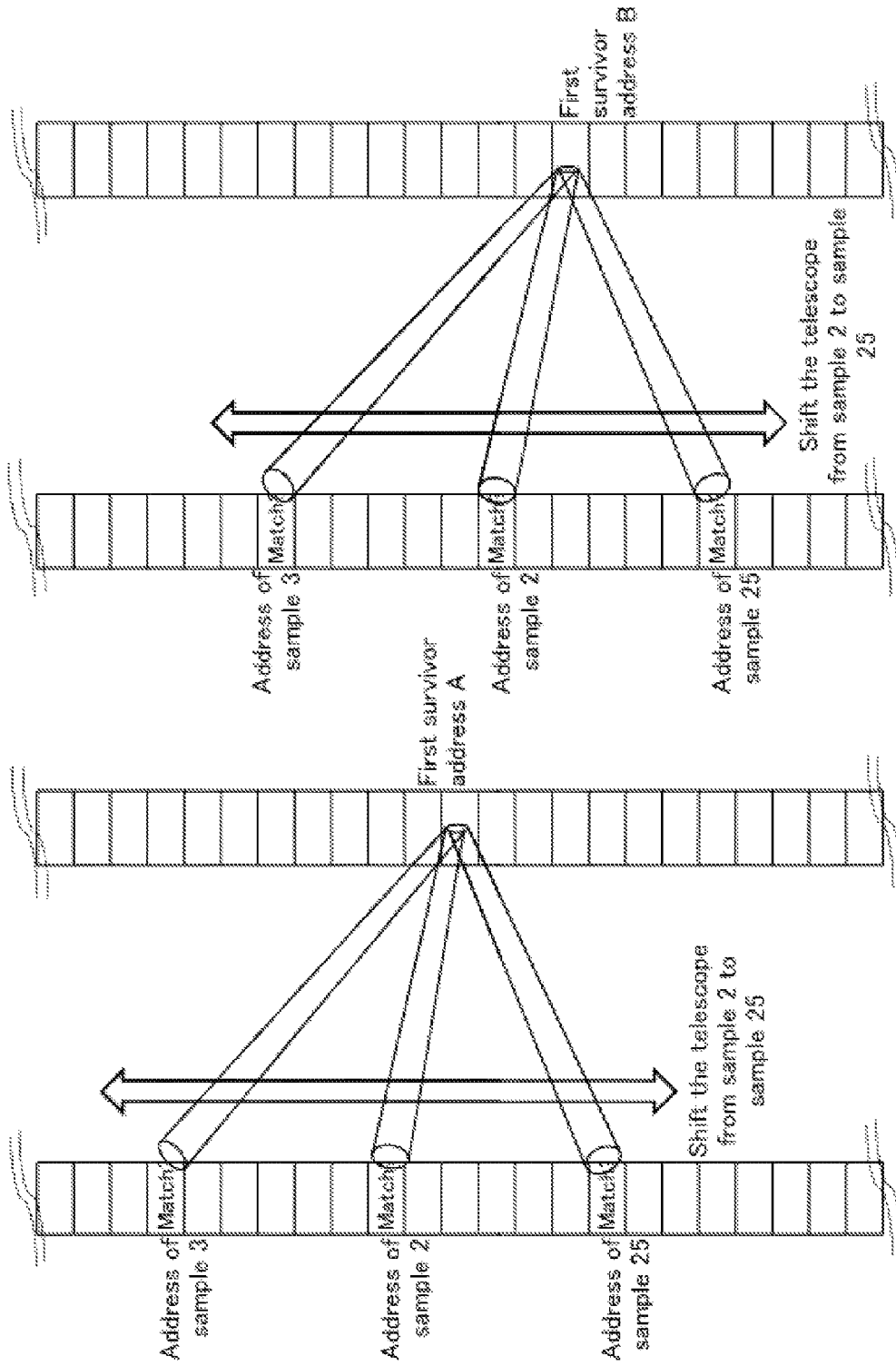
FIG. 8 depicts a second analogous example of an address swap.

FIG. 8 (a second analogous example of an address swap) depicts the two first survivor addresses A and B of FIG. 7 on their coordinate system. As analogously shown in this figure, each of the first survivor addresses looks into its telescope at samples 2 to 25 of the data comparison circuits and captures matching data comparison circuits as survival outputs, if any.

Needless to say, an object of each telescope is sequentially switched using the relative address comparison data, which is data for comparing the relative positional relationships.

In practice, a match output from a second, third or N-th comparison with no relative relationship with any first survivor address is added to its relatively-shifted address, but that would be a sporadic event and would not result in match outputs concentrating on a particular address if samples are set appropriately and unintentionally. This is because a sample image (information) and an unknown image (information) usually do not have a special relationship (pattern) of sharing any particular identical part. Receiving the value 1 to its counter earlier than any subsequent survivor addresses, an first survivor address always takes priority of receiving the cumulative counts and it has an analogous image of being a ruler which has a right to collect all the match outputs as survival outputs on behalf of its sample address group that is associated with relative addresses based on the first survivor address.

Figure 9:
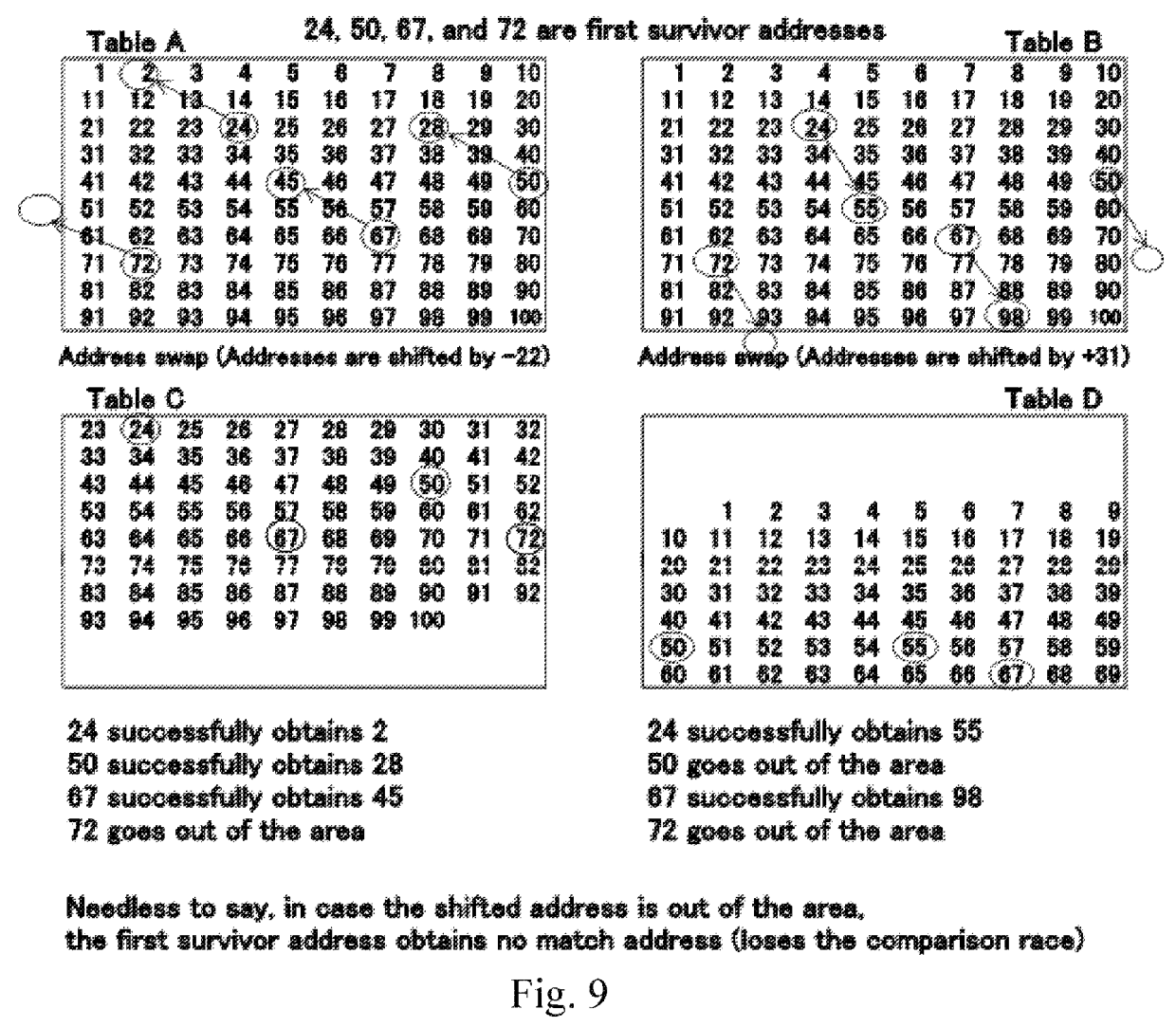

FIG. 9 (a third analogous example of an address swap) depicts an address swap example in an actual two-dimensional address array. Tables A and B show addresses (coordinates) 1 to 100 before an address swap, wherein four addresses (coordinates) 24, 50, 67 and 72 are first survivor addresses.

Table A shows the case in which a second comparison is performed on data comparison addresses located at relative addresses which are −22 from the first survivor addresses; in this case, the address 72 has no relative address within its address group. Table B shows the case in which a third comparison is performed on data comparison addresses located at relative addresses which are +31 from the first survivor addresses; in this case, neither the address 50 nor 72 has relative address within its address group. Table C shows an address group that is shifted −22 from that of Table A, wherein each of the first survivor addresses 56, i.e., 24, 50 and 67 may successfully obtain its respective match/mismatch result on its respective relative addresses; when obtaining a match result, its counter may count up the result as a survival output (swap-count). Table D shows an address group that is shifted +31 from that of Table B, wherein each of the first survivor addresses 24 and 67 may successfully obtain its respective match/mismatch result on its respective relative addresses; when obtaining a match result, its counter may count up (swap-count) the result as a survival output.

The above will be repeated for a predetermined times and only the first survivor addresses which are successfully shifted to data comparison addresses with correct coordinate positions may survive until the end.

Although the present invention has been described with reference to various embodiments, the above-described steps are equivalent with: performing an address swap (address transposition) from the respective first survivor addresses as references in order to sequentially determine the match or mismatch in dual-parallel manner whether or not data items at the swapped addresses are identical with those of the respective sampling points 113 compared (data matches) and whether or not data items exist at the desired positions (relative address comparison data); performing logical product (AND) operations in parallel; and outputting the results to the number-of-survivals counters 135 of the first survivor addresses for each comparison. The address swap circuit 134 is an extremely efficient logic circuit for integrating two functions of the parallel address-match/mismatch determination in the lower part of FIG. 4 and the dual parallel logical product operation, in other words, means for performing equivalent dual parallel logical product (AND) operations.

As final results, the N-th survivor addresses (N being the final number of comparisons) may be read out by the survivor address output processing circuit 138 and the output bus 124 so that addresses in information groups including the N-th survivor addresses may be identified, in other words, pattern recognition may be performed.

The number-of-comparisons counter 129 may be configured as a pre-settable counter so that addresses of the counters with any count value such as N (N-th survivor addresses) or any fewer number for the state in progress by specifying the number-of-comparisons signal 143.

It should be noted that either the input or output side of the address swap circuit 134 may be subject to the address swap (address transposition) since it is a relative conversion.

As shown in FIG. 6, the example of the address swap circuit 134 prepares for a register for converting addresses, transposes the pre-address-swap match outputs 141 on the side of the data comparison circuits 133 into the post-address-swap match outputs 142 using the coordinate data of the relative address comparison data. Since this register operation relatively shifts all addresses, this operation may be easily implemented with means for shifting data by addition or subtraction, or a shift register with a data length equal to the number of addresses as the simplest means.

Also a shift register for serial processing may achieve fast address swap (address transposition) if its circuit structure is appropriately planned.

The above address swap method using the register is only an example for descriptive purposes, and other methods, for example, directly using an address decoder to swap (transpose) addresses may be implemented. Similarly, the address swap circuit 134 and the number-of-survivals counters 135 are essential means in order to accomplish the information refinement of the present invention, but the present invention is not limited by this structure and other methods may be implemented for individual addresses.

As described above, the address swap (address transposition) not only refers to a transposition of physical addresses, but also extends it to a transposition of information included in each address using the shift register.

This method of global match/mismatch determination for both data and relative relationships of data addresses is equivalent with a method of performing the dual parallel match/mismatch determination based on the data comparison conditions as well as the address comparison conditions on all of the memories 132, as shown in FIG. 4, and further performing the logical product operations in parallel; therefore, this method eliminates the need for sequential address processing of the von Neumann architecture, which is performed on each individual address in principle.

Accordingly, in the case of the unknown image having 2 million pixels each including 12 bits of color resolution with 4096 data groups (data combinations), the number of data comparisons required to ensure the detection of one or more identical or a desired images within this unknown image may be typically 2 to 3 and up to the number of samples (25 in this example).

Further, since the present method repeats the pattern matching on all coordinates using the input data and the first survivor addresses as reference origins (all of the memories are subject to comparison each time), as shown in FIG. 7, not identical, but similar images such as ones lacking a part of the desired image (hereafter, referred to as "similar images") may also be detected.

In the example of FIG. 2, after the 25th comparison, the counter values of the address 1 of the groups A, B, C, D and E are 1, 10, 21, 25 and 22, respectively. Here, each of the addresses with a high counter value may imply an image with a part missing or an approximate image, wherein these addresses may be other than the first survivor addresses 56. In order to detect these nearly identical images, addresses (coordinates) with the counter value equal to or greater than a certain value (e.g., 20) may be read out and, their surrounding addresses (coordinates) may be examined in detail if necessary after a predetermined number of comparisons (25 times in this case). Therefore, this method not only detects identical images fast, but also effectively detects approximate images based on a certain definition.

In addition, this address swap (switch) may be further advanced to allow detection of resized or rotated images (hereafter referred to as "variant images") with a minimal number of detections.

Embodiment Example 6

Figure 10:
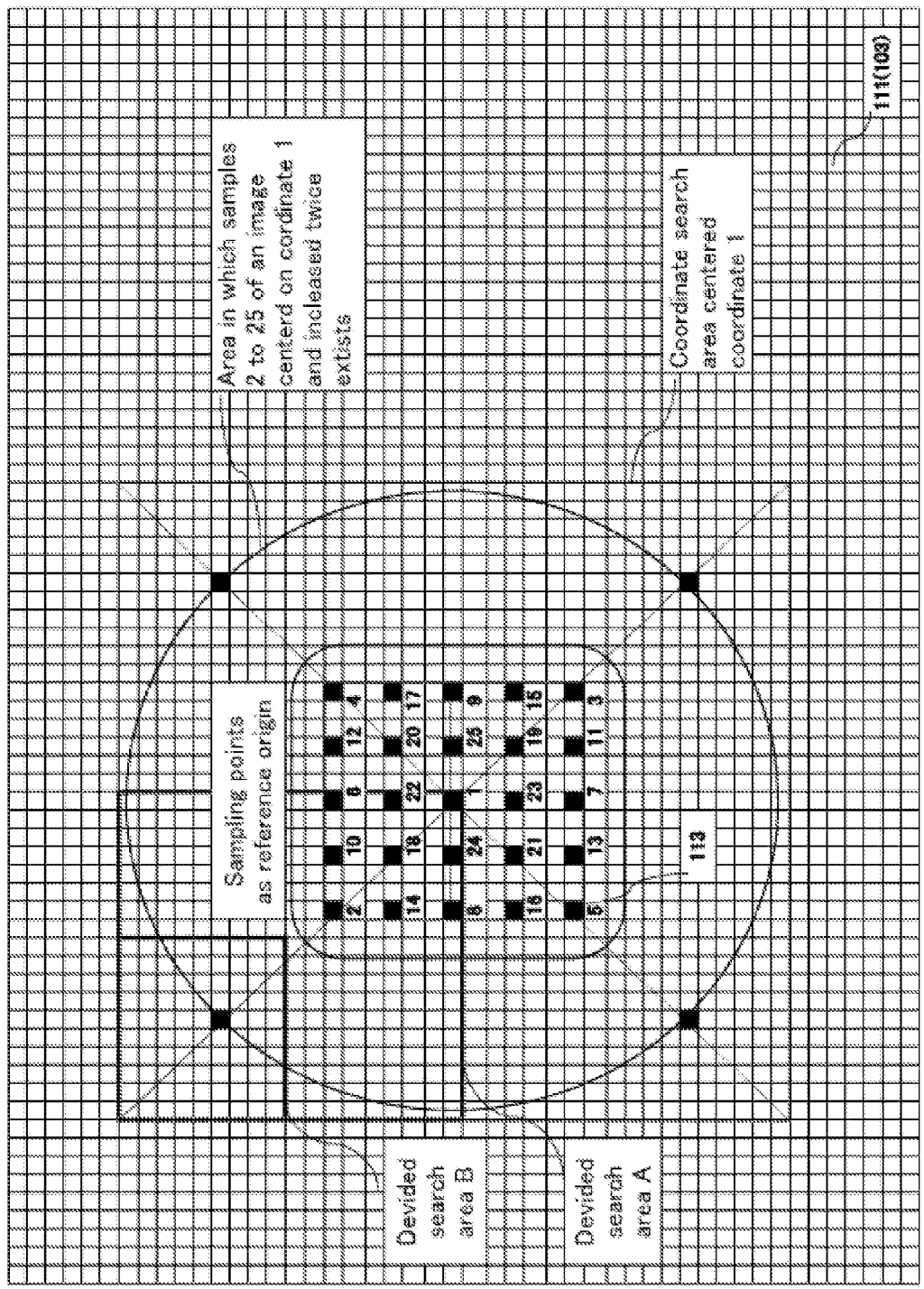
FIG. 10 depicts a concept of a variant-image detection (Embodiment Example 6)

FIG. 10 (a concept of detecting variant images) depicts a method of effectively detecting a variant image which has been resized or rotated, or in some cases, modified compared to its original image.

This figure is superimposing sampling points 113 of a known image on a first survivor address 56 of an unknown image which survived the first sample comparison. This example illustrates a case in which the size of the unknown image centered on its coordinate 1 as a reference origin may be increased twice along the X- and Y-axes (four times in the screen).

If there is a desired variant image in a circle illustrated in this figure, all coordinates of samples 2 to 25 corresponding to the variant image should exist within the circle; therefore image detection range for the coordinate 1 should be a coordinate range encompassed this circle.

Accordingly the concept of shifting addresses (coordinates) may be extended in order to detect a variant image by determining whether there are coordinates respectively having the same data as that of corresponding samples within the coordinate range specified from the coordinate 1 reference origin, and whether or not there are any such coordinates regardless of the number of them to thereby determine whether there are any coordinates corresponding to a specified number of samples (25 in the present example).

Also in this case, the probability of the image detection may be increased by determining a characteristic quantity of the samples, maintaining the number of samples and their image identification effectiveness at certain levels and defining a certain range subject to the detection.

Here again, such variant images may be detected with a minimal number of data comparisons which is equal to or less than the number of samples by using means for cumulatively storing the match (survival) outputs for both data and address comparisons only in the first survivor addresses 56 in each comparison, wherein the means is cumulatively counting up the number-of-survivals counters 135 for the addresses 1 in this example.

Embodiment Example 7

Figure 11:
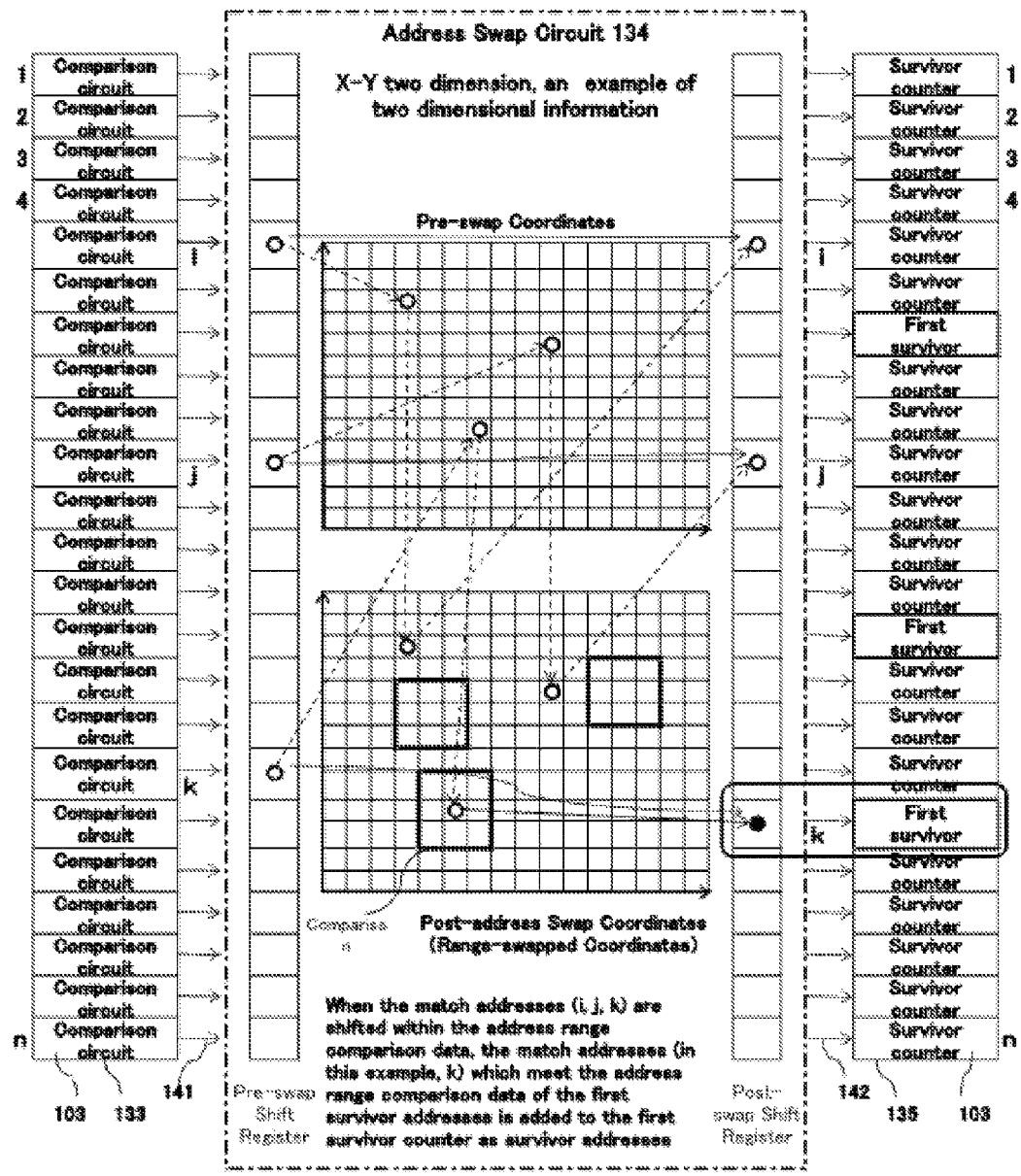
FIG. 11 depicts a second example of an address swap circuit (Embodiment Example 7)

FIG. 11 (a second example of an address swap means) depicts a structure which implements the foregoing concept by considering the address-shift conversion of a 1-to-1 correspondence, as illustrated in FIG. 6, as conversion of a 1-to-an address range correspondence, externally entering the converted addresses into the address comparison data 127 as address range comparison data, retrieving the pre-address-swap match outputs 141, i.e., i, j and k, as address ranges each having a match address range, and as address ranges meeting a comparison condition, and entering the post-address-swap match outputs 142 in the number-of-survivals counters 135 of first survivor addresses within each address group. This may be analogously interpreted as a parabolic telescope for astronomy instead of the telescope of FIG. 7 and each astronomical telescope captures a survival output into its first survivor address.

For example, when one coordinate is taken as a reference of an image within the image range of about 1000 pixels, as shown in FIG. 1, a coordinate range of over 7000 pixels, which is centered on the one coordinate and extended along the X- and Y-axes from the original image range, may be used as a comparison coordinate range enabling a detection of enlarged and rotated variant images up to twice as large as originally desired images of FIG. 1 with a minimal number of data comparisons which is equal to or less than the number of samples.

For reduced-size images or images whose coordinates have been converted, some of their coordinates corresponding to the sample coordinates may be lost, but an appropriate criterion on the number of sample matches may be provided accordingly. Although the image detection probability of the present method is lower compared to the method using complete matches of relative coordinates discussed in connection with FIG. 6, the image identification effectiveness and the number of sampling points may be appropriately selected to allow an extremely fast image detection.

Further, the memory data comparison circuits may compare data values such as brightness or color levels in a certain range from the match/mismatch comparison to thereby detect variant images as well as similar images depending on a definition of the comparison.

In such cases, ternary memory with the "Don't Care" option may be provided to the determination results in addition to the match and the mismatch options for each memory bit so that each memory may have three values for more effective comparisons.

Typically, detecting resized or rotated images requires an extremely large number of search processing steps including coordinate conversions. The present method, on the other hand, enables a detection of a desired image (including an approximate image) with a number of comparisons which is only up to the number of samples.

In most cases, only a position of the center or the center of mass of a variant or similar image needs to be detected as above, but the present method may even accommodate a need for detecting the magnification or the rotation angle of an image by adding some number of data comparisons.

For such a need, after detecting a range in which an image may exist, coordinates of the four diagonal corners such as 2, 4, 3 and 5 in FIG. 10 may be determined by dividing the coordinate range into 4 segments such as a detection segment range A, or into 16 segments such as a detection segment range B, and performing a detection within the limited range. When the coordinate range is divided into 4 segments, and then 16 segments, an approximate degree of image variation may be determined in 16 and 64 times of data comparisons, respectively, i.e., 80 times in total.

Typically when detecting a variant image whose degree of image variation is difficult to estimate, it is necessary to infer a possible image variation, and perform many coordinate conversions and pattern matching. In contrast to such variant-image detections, the present embodiment allows incomparably fast pattern matching. More accurate detections are possible by increasing the number of detection segments.

The above is only an example and complex images are also detectable by adding a minimal number of data comparisons.

In the present example, all of the sampling points 113 were used in a large detection range with an assumption that a desired image may have been resized or rotated, but different detection ranges may also be specified for the individual sampling points 113. This method is also significant when compensating uncertainties of data items and their addresses if identical or similar data items successively exist, and a broad range of images including identical, approximate, variant and similar images may be detected by defining a similar image based on the positions and data of the sampling points 113.

Besides the two detection methods described above, i.e., the method of shifting coordinates (determining the match/mismatch between the sample addresses and the relative addresses compared) and the method of segmenting the detection ranges (determining if the relative addresses exist within the compared coordinate ranges), the memory 121 also enables other applications of the address swap such as detection outside of the compared coordinate ranges and all of these applications may be implemented simply by setting different data in the address swap circuit 134 and the address comparison data 127; accordingly, a configuration integrating these different settings and more diverse image detections may be possible by combining these image detection methods.

For simplicity of explaining the present example, the R, G and B color data has been described as stored together for each address, but it may be easily implemented to compare each of the R, G and B data independently for each address.

This memory 121 may be easily mass-produced due to its quite simple structure constructible from simply structured memories capable of comparing memory data in parallel, means for performing the address swap (switch) in, for example, content-addressable memories, counters for storing the number of matches and a typical priority encoder.

Needless to say, the memory 121 is also a device for fundamentally reducing the number of searches (comparisons) for a combinatorial problem based on data and relative relationships of data addresses and significantly reducing the number of data comparisons to minimum up to the number of samples if the samples are properly selected, and it is applied to image detections based on coordinate correlations of clustered similar characteristics and other various information detections.

Although the above discusses repetitive information refinement, it is needless to say that the refinement may be performed only once, e.g., by the first or the second comparison.

Thus, by using the memory 121 having intelligence capable of detecting information by itself, a CPU or GPU may substantially reduce its load in detecting information by simply providing the input data and receiving the results.

Since the information detection may be done extremely fast, information for the detection may be segmented when there is not enough memory size.

Even if at least 1 μs is required for each data comparison processing, this memory 121 may detect any image or information regardless of its size within several μs up to several hundred μs; this detection is broadly applicable to when detecting information on one frame of a movie or when known information 1 to be detected exists successively and numerously.

It is understood that a typical CPU for accessing the memories 132 of the memory 121 may be used in combination to allow further improvement of information detections.

The present invention has been described with respect to image information, but this information detection method and the memory 121 are also effective to detect one-dimensionally arrayed information (e.g., audio) and multi-dimensionally arrayed information.

Embodiment Example 8

Figure 12:
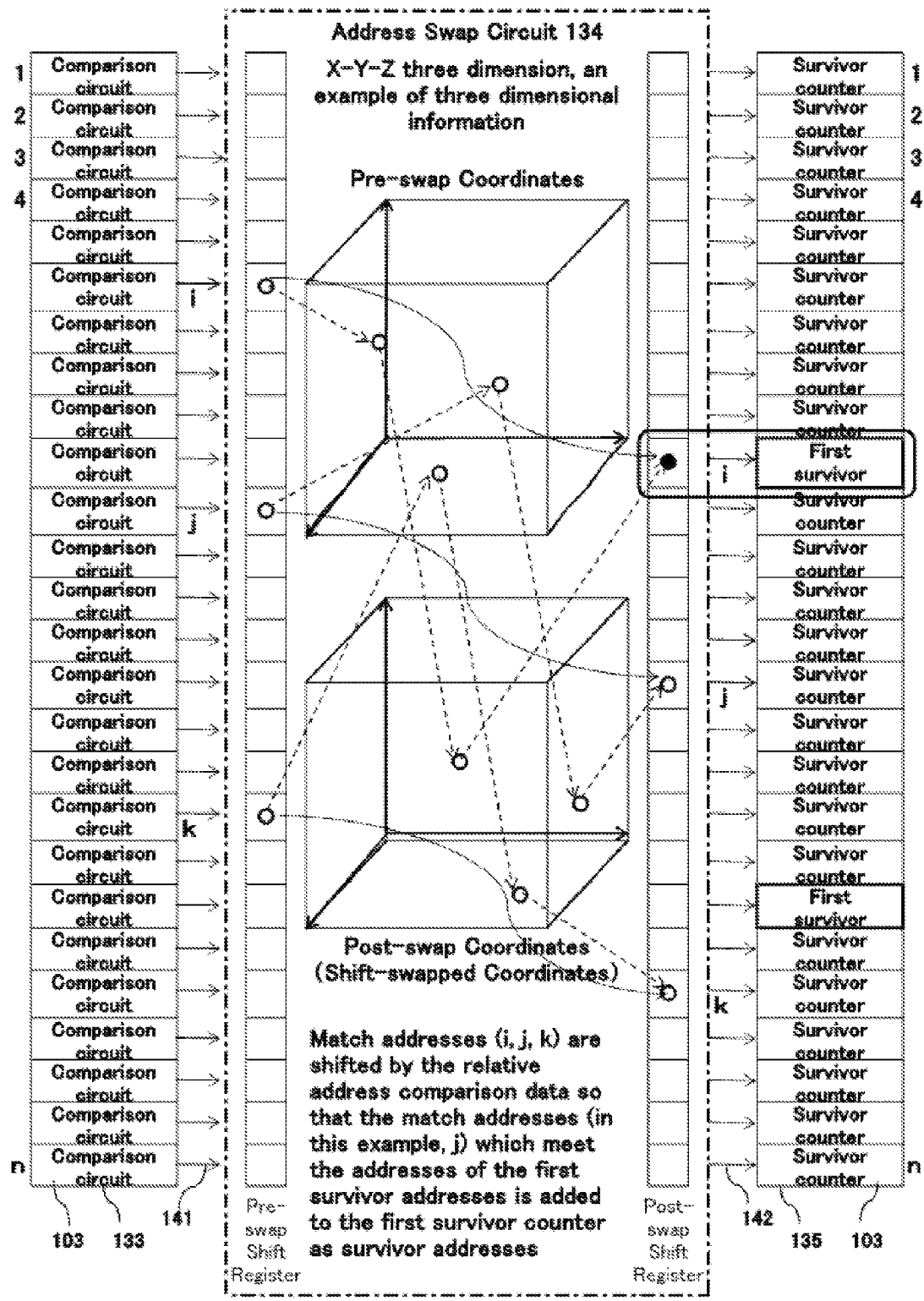
FIG. 12 depicts a third example of an address swap circuit (Embodiment Example 8)

FIG. 12 (a third example of an address swap means) depicts an extension of the two-dimensional information of FIG. 6 to three-dimensions with X-, Y- and Z-axes; this embodiment example is capable of detecting identical or similar arrays in a three-dimensional space, whose specific example of information detection will be discussed herein below, and may also be extended to N-dimensional space.

As described above, the memory 121 provided with the information refinement detection function is capable of counting the number of survival times for all of its memory addresses and successively detecting identical or similar information using the number of survival times, but also enables to reduce the number of circuits for the number-of-survivals counters 135, the OR gates 136 and the inhibit gates 137 in order to accommodate a large number of memories and to further simplify the circuit structures.

Embodiment Example 9

Figure 13:
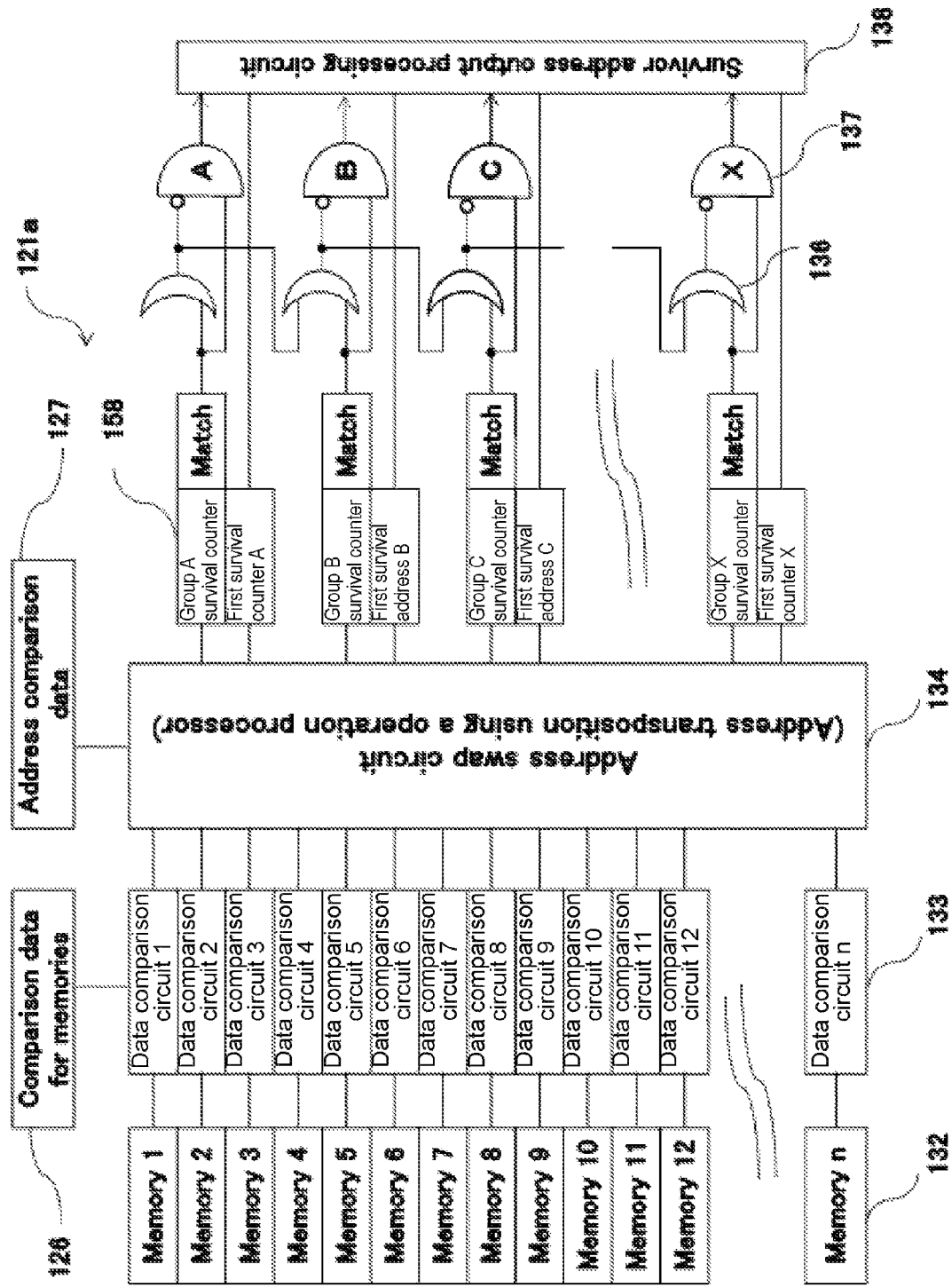
FIG. 13 depicts an example of reducing the number of information refinement detection circuits (Embodiment Example 9)

FIG. 13 (an example of reducing the number of information refinement detection circuits) depicts how the number of circuits may be reduced according to the basic concept of the memory 121, as shown in FIGS. 4 and 5, wherein considering the fact that the number of circuits utilized after the number-of-survivals counters 135 is the number of the first survivor addresses that are normally derived from the first comparison as discussed above (in the case of 2 million pixels each with the resolution of 4096, there are 488 probable addresses having one particular color), the number of circuits after the number-of-survivals counters 135 is reduced to the comparable number, for example, one-thousandth (1/1000) or one-two-thousandth (1/2000) of the number of addresses in the memories 132, which reduced circuits are indicated by A to X in this figure.

In this case, counters for the number of survival times for each group 158 (number-of-survivals counters by group 158) may store the first survivor addresses of their respective address groups illustrated in FIG. 7, and the first survivor addresses may be known out of each of these counters 158.

In this structure, one or more address operation processors may be provided to the address swap circuit 134 for swapping addresses. Thus, wider range of information refinement techniques may be expected by increasing a degree of freedom for the address swap (address transposition) using the operation processor.

An alarm may be set up for issuing a warning when too many first survivor addresses cause an overflow so that the samples for the first comparison may be modified.

Another way to reduce the number of circuits is to implement a circuit structure for switching the dual parallel logic operations for each memory bank.

Also the number of circuits may be significantly reduced by simply flagging surviving addresses as a result of each refining, without counting the number of matches for each comparison.

Although it is ideal to have the method capable of counting the number of matches for all memories with no limitation on the possible number of first survivor addresses, a memory 121a with a simplified circuit structure for information refinement as described above may also ensure the detection of desired images using the above-discussed method of detecting information.

Such a structure may increase a degree of freedom of this memory 121*a* such as for the number of memory addresses and their respective number of bits, and a ternary memory may also be used as discussed above.

Figure 14:
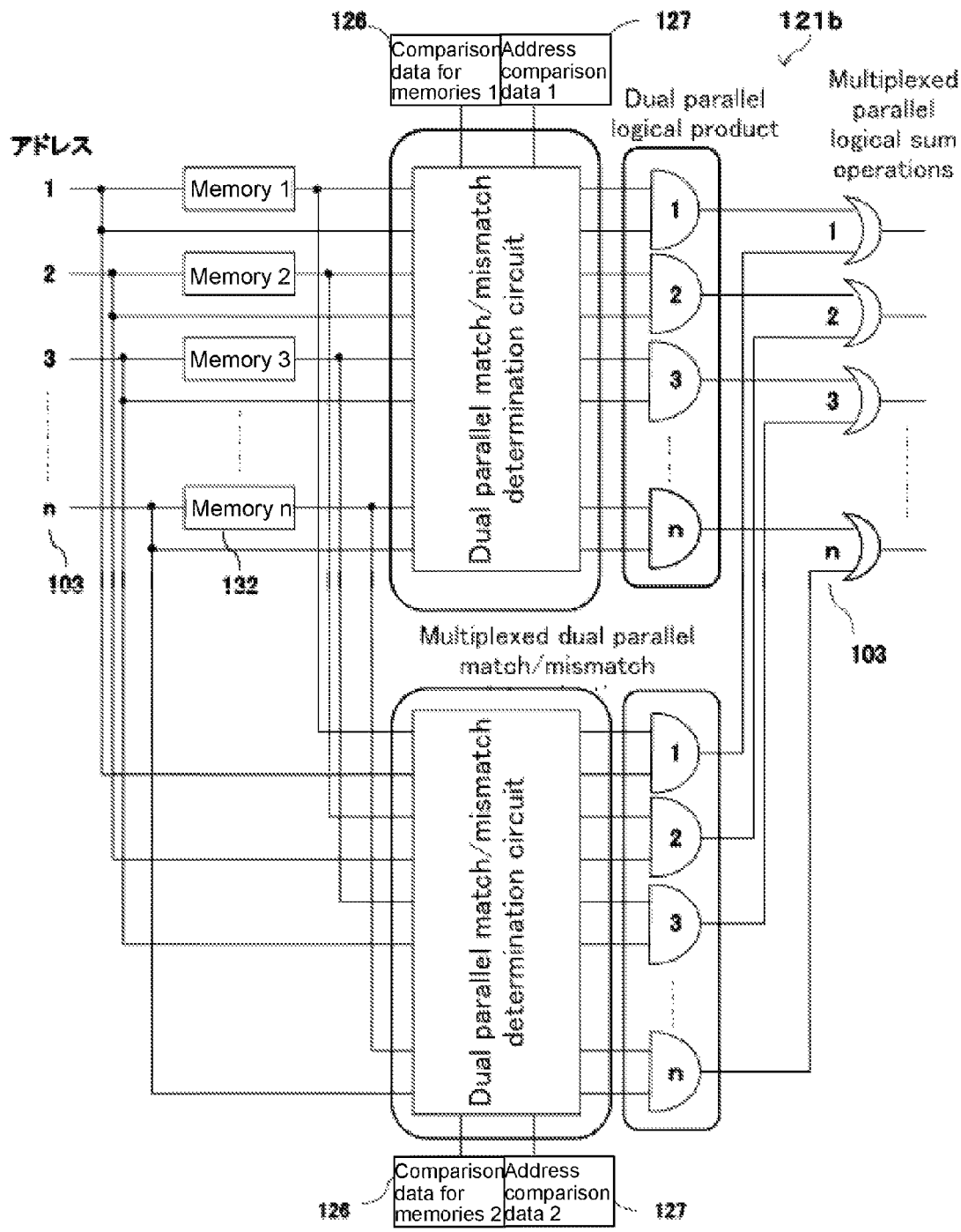
FIG. 14 depicts an example concept of multiplexed dual parallel logic operations for data and addresses.

FIG. 14 (an example concept of multiplexed dual parallel logic operations for data and addresses) illustrates an example of multiplexing the dual parallel logic operations described in reference to FIG. 4.

As shown in this figure, a memory 121*b* has two sets of comparison data for comparing memory data and two sets of data for comparing addresses, two sets of circuits for performing dual parallel match/mismatch determinations and two sets of circuits for performing dual parallel logical product operations; and this memory 121*b* is configured to further perform and output the results of parallel logical sum (OR) operations on the results of the above dual parallel logical product operations.

Such a structure may also be implemented by applying the circuit structure of the memory 121 shown in FIG. 5.

This structure may detect two patterns simultaneously.

This is only an example of multiplexed operations and combinations of more than two sets may be possible; also exclusive logic operations and any other logic operations may be performed as well as the logical product (AND) or the logical sum (OR) operations.

More advanced information detections are possible by multiplexing the structure as above and using various dual parallel logic operations depending on a type or purpose of information to be detected.

To summarize the structure of the memory 121 of the present embodiment discussed above in reference to FIGS. 4, 14 and the like, this memory is capable of storing and reading information in each memory address, and comprises:

means for externally entering first and second input data, wherein the first data is for comparing data items stored in the memory, and the second data is for comparing addresses in the memory; (1) means for determining a data match/mismatch by comparing in parallel the data items stored in the memory, according to the first data; (2) means for determining a memory address match/mismatch by comparing in parallel the addresses in the memory, according to the second data; and (3) a data-and-address dual parallel logic operation means for performing logic operations in parallel on the match/mismatch results from both of the (1) and (2).

Alternatively, this memory is a memory provided with the information refinement detection function capable of storing and reading information in each memory address, and comprises:

(1) means for externally entering first and second comparison data, wherein the first comparison data is for comparing data items stored in the memory, and the second comparison data is for comparing addresses in the memory;
(2) means for determining a data match/mismatch by comparing in parallel the data items stored in the memory, according to the first comparison data;
(3) means for determining a memory address match/mismatch by comparing in parallel the addresses in the memory, according to the second comparison data; and
(4) a data-and-address match/mismatch result logic operation means for performing logic operations in parallel on the match/mismatch results from both of the (2) and (3) for each address.

Further, as an example of circuit structure for simplifying the information refinement, the memory provided with the information refinement detection function of claim 1 integrates the means for determining a data match/mismatch of the above (1) and the dual parallel logic operation means of the above (3) into means for performing equivalent dual parallel logical product (AND) operations, whose operation results are equivalent to a logical product (AND) of the match/mismatch determination results of (1) and (2).

Alternatively, the logic operations of the memory provided with the information refinement detection function are logical product (AND) operations, wherein the memory provided with the information refinement detection function for performing the logical product (AND) operations comprises:
(1) means for determining in parallel a memory data match/mismatch upon a first information detection according to the first comparison data and storing at least one or more matching memory addresses as first survivor addresses;
(2) means for transposing matching memory addresses, which have survived a parallel memory-data match/mismatch determination according to a new set of the first comparison data, by an address transposition means according to the second comparison data and obtaining the address-transposed addresses; and
(3) means for performing logical product (AND) operations of (1) and (2), and outputting the addresses which survived the logical product (AND) operations.

Further, in order to repeatedly perform the dual parallel logic operations 60, as shown in FIGS. 5, 13 and the like, the memory provided with the information refinement detection function for performing the logical product (AND) operations comprises:

a plurality of counter means for counting the results from the means for performing equivalent dual parallel logical product (AND) operations for each comparison for each memory address;

means for counting up to 1 respective values of the counter means of the matching memory addresses which are determined in parallel by a memory data match/mismatch according to the first data, and obtaining the matching memory addresses as first survivor addresses upon a first comparison;

means for calculating respective address position relationships between the matching memory addresses which are determined in parallel by a memory data match/mismatch according to the first data and the first survivor addresses, using the means for performing equivalent dual parallel logical product (AND) operations according to the second data, counting up respective values of the counter means of the first survivor addresses and obtaining N-th (here, N is an integer equal to or greater than 2) survivor addresses which survived subsequent comparisons; and means for outputting the N-th survivor addresses.

Alternatively, in order to repeatedly perform the dual parallel logic operations, as shown in FIGS. 5, 13 and the like, the memory provided with the information refinement detection function for performing the logical product (AND) operations comprises:
(1) a plurality of counter means for counting the comparison match/mismatch determination results according to the comparison data which is provided for a predetermined number of times;
(2) means for increasing to 1 respective values of the counter means of the matching memory addresses and obtaining the matching memory addresses as the first survivor addresses upon the first information detection;
(3) means for cumulatively adding results of the logical product (AND) operations to count up respective values of the counter means of the first survivor addresses using the address transposition means and obtaining N-th (here, N is a number of comparisons equal to or greater than 2) survivor addresses which survived subsequent comparisons upon the subsequent information detections; and (4) means for outputting the N-th survivor addresses of the above (3).

Moreover, the means for performing equivalent dual parallel logical product (AND) operations is a memory for repeatedly performing address swaps (switches) by an address swap (switch) means according to the second data for comparing addresses. In other words, the address transposition means of the memory for performing the logical product (AND) operations transposes addresses in parallel in an entire address range according to the second comparison data in the memory provided with the information refinement detection function.

Further in the above memory, the second data for comparing addresses is used based on the first survivor addresses, and is one or both of (1) comparison data for determining whether or not addresses to be compared match relative addresses, respectively, and
(2) comparison data for determining whether or not addresses to be compared exist within a range to be compared.

Alternatively, the second comparison data for comparing memory addresses, of the memory for performing the logical product (AND) operations uses the first survivor addresses as reference addresses and, upon the subsequent information detections, the second comparison data is either one of:
(1) comparison data for determining whether or not relative positions of matching memory addresses, which have survived a parallel memory-data match/mismatch determination according to the first comparison data, and the reference addresses match, respectively; or
(2) comparison data for determining whether or not the relative positions of the matching memory addresses and the reference addresses exist within a range, respectively.

Further, the above memory is a memory capable of reducing the number of information refinement circuits, multiplexing dual parallel logic operations and performing various multiplexed dual parallel logic operations as well as logical product (AND) and the logical sum (OR) operations for data and addresses.

The memory 121 itself according to the present embodiment has been described above, and information detection examples in one- and multi-dimensional spaces will be discussed below.

Embodiment Example 10

Figure 15:
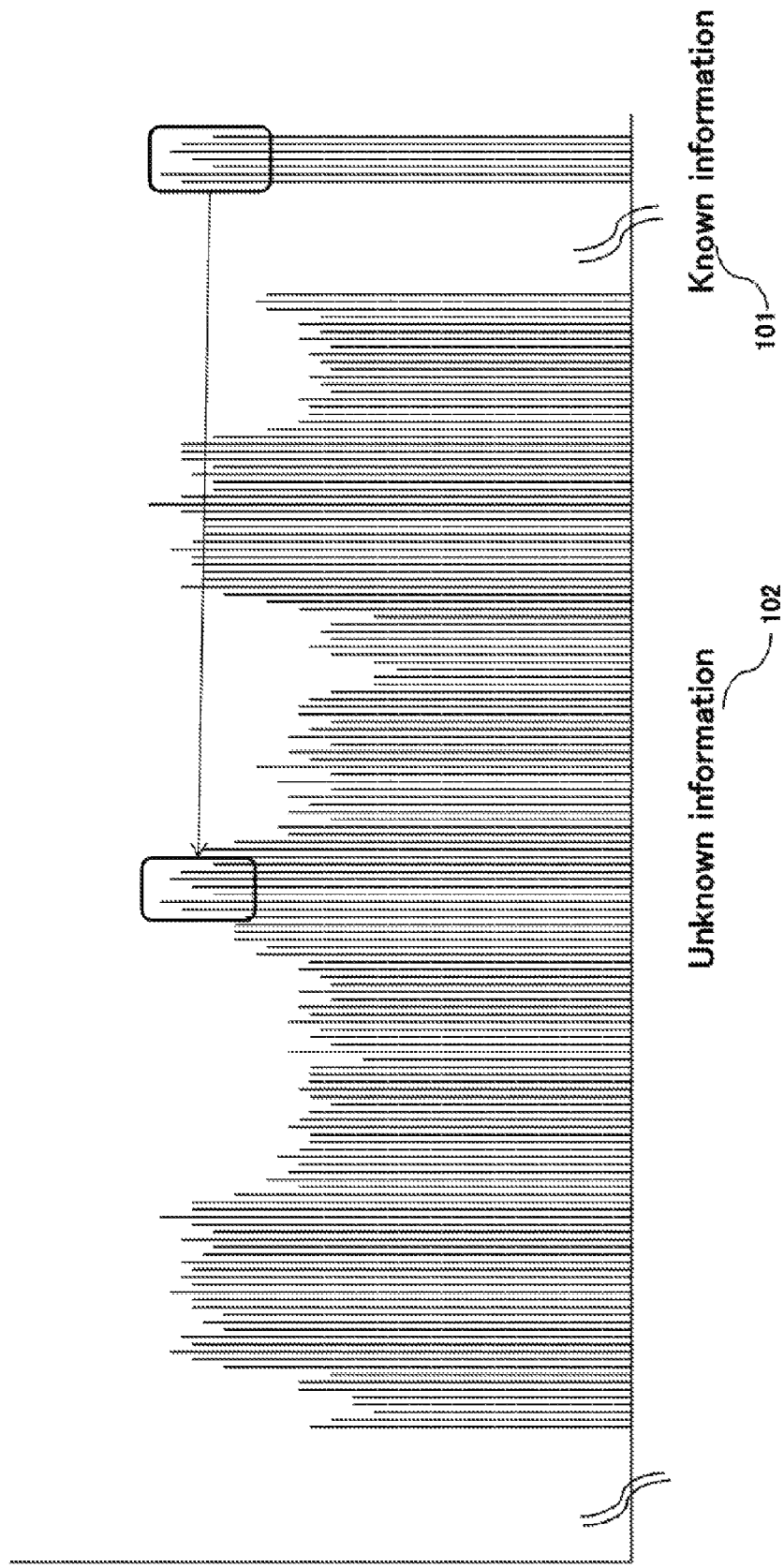
FIG. 15 depicts an information detection example for a one-dimensional address array (Embodiment Example 10)

FIG. 15 (an information detection example for a one-dimensional address array) illustrates a horizontal axis representing, for example, a time axis corresponding to addresses and a vertical axis representing data of an economic trend, a stock price, an air temperature or the like, wherein known information given as a set of samples is searched for from unknown information, i.e., a vast historical database; such an information detection may be easily performed by using data stored with one-dimensional array which associates memory addresses with the time axis.

As another example of information detection through a time axis, audio information may be searched for based on a sampling time before compression and audio data corresponding to this sampling time, or audio data for each audio decoding unit, i.e., AAU (audio access unit) of compressed audio data.

As an example memory 121 capable of three-data-value comparisons, spectrum bands of a human voice or the like may be divided into data items in different classes, and each data item for each time frame may be stored in each address to thereby enable creation of a time-series array quite easily. This time-series array may be compared with a template audio source or the like for a similar pattern recognition to allow an extremely fast audio recognition in various applications.

Also such a detection for one-dimensional array information is very effective in performing a fast analysis such as sequencing of a DNA or the four genome nucleotides which require intensive information processing. Similarly, a fast analysis using a character-string array may also be effectively implemented.

Sometimes called as worst enemies of the information society, computer viruses are malicious software programs which are created with an intension to penetrate computers via networks and the like and destroy or erase data in the computers.

Anti-computer-virus software typically uses a program character string as an information pattern to perform software processing for a pattern recognition by a CPU in order to prevent the virus penetration.

Thus, today's CPU's each bears a large load for the information search, resulting in a significantly compromised performance of its entire information processing device.

Even character-string patterns of such computer viruses as the worst enemies of computer users may be found quickly without causing a large burden to CPU's by using the memory provided with the information refinement detection function to thereby minimize the performance reduction of the entire information processing device.

Embodiment Example 11

Figure 16:
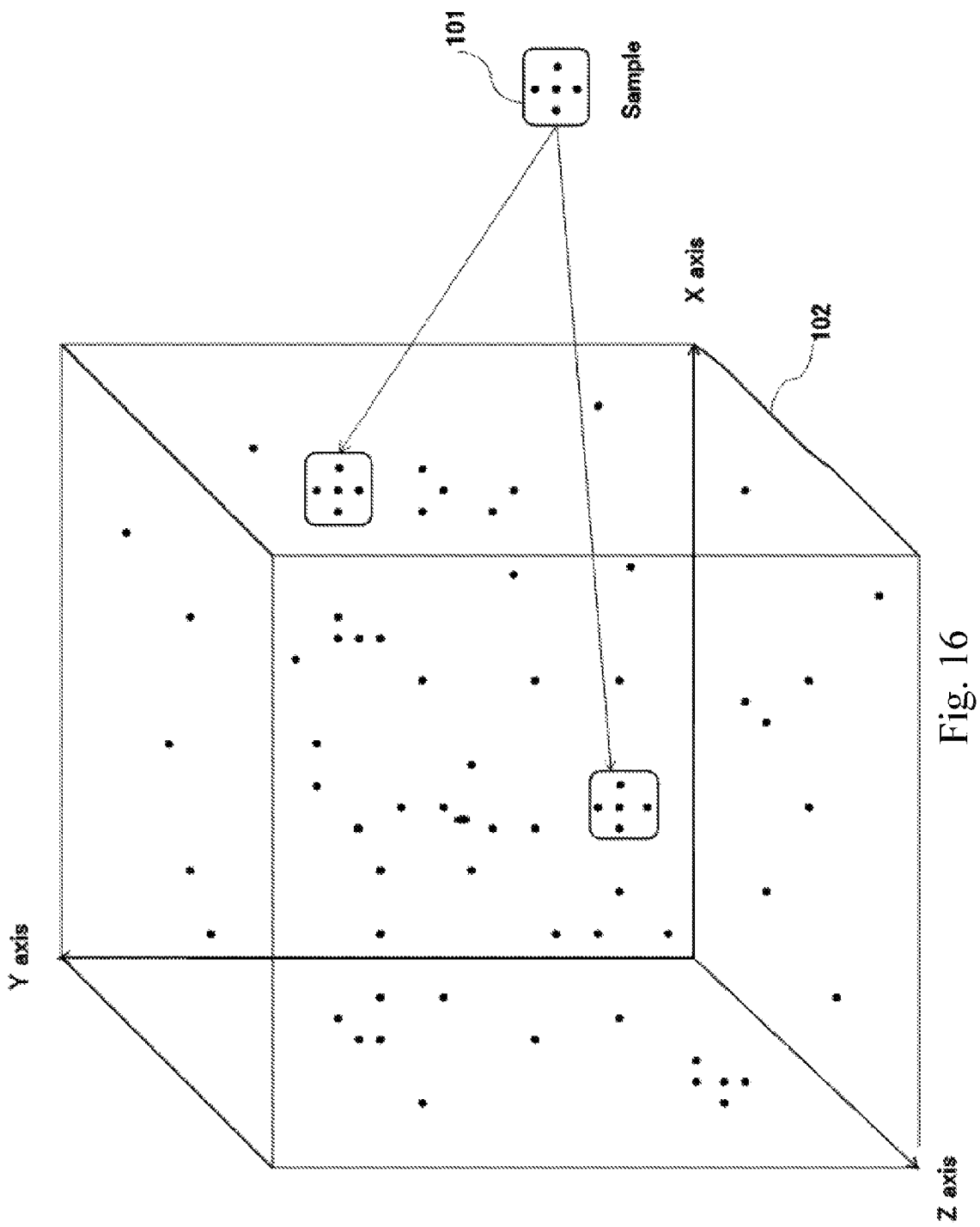
FIG. 16 depicts an information detection example for a three-dimensional address array (Embodiment Example 11)

FIG. 16 (an information detection example for a three-dimensional address array) illustrates an example of detecting information arranged in a three-dimensional space.

As shown in the figure, a particular pattern arranged in the three-dimensional space is detected in a method similar to ones discussed above.

Needless to say, three-dimensional spaces, including the real space in which we exist, are applicable to all three-dimensional information for which three-dimensional positions and their respective data may be quantified. Further, this may be expanded to multi-dimensional information such as spatio-temporal information by adding a time axis.

Information detections in such three-dimensional spaces may be utilized for analyses of any positional relationships in atomic and molecular levels to the cosmic space.

Since the present invention allows fast detection, robots which require realtime processing in particular may benefit from limitless applications such as three-dimensional pattern recognition, three-dimensional object recognition and three-dimensional moving-object tracking for which many template screens may be compared with a fast-moving object or the like.

Any of these applications may be easily implemented by storing data in address arrays so that each memory address corresponds with a position along three axes, i.e., X-, Y- and Z-axes. Needless to say, not only identical information, but also approximate and similar information may be detected as discussed above in reference to image detections.

In the above, pattern recognitions has been performed through information already arranged or addressable in addresses in one- to multi-dimensional spaces, but information detections exploiting conventional algorithms may also be used in combination with the present embodiments, for example, by modifying address and data arrangements by categorizing and clustering addresses into information groups and performing an information detection through the information groups.

The above has been an overview of information detections in one- to multi-dimensional spaces, and operational characteristics of the memories 121, 121a, 121b may be summarized as follows.

Information detections using the memories 121, 121a, 121b are based on detection units of one address and its data and may ensure fast detections of strictly and accurately identical information in particular as well as broader information such as approximate, variant and similar information by using different methods of configuring the input data.

The number of samples and a method of selecting the sampling points 113 for the information detection may be evaluated with statistical techniques, and the sampling may also be automated. In this case, needless samples may be omitted to rationalize the time required for the detection. Also the ability to set the sampling points 113 for each address (coordinate) is one of the characteristics of the present invention.

Further, it may be noted that the present invention may decide to terminate the detection very quickly when there is no desirable information in the unknown information 102.

The present detection method is not limited by sizes of the known information 101 and the unknown information 102 as long as certain conditions are met; therefore, this method is applicable to any information, and also information may be segmented according to sizes of the memories 121, 121a, 121b.

Pattern recognitions are possible even from a memory which stores therein more than one kind of information including one- and multi-dimensional and other information.

In addition, one significant characteristic of the present method is that other than preparing the sampling points 113, no data preprocessing is necessary such as information modification and characteristic extraction, which are done in other pattern recognitions, if unknown information 102 is appropriately stored in addresses of the memories 121, 121a, 121b.

Another significant characteristic of the present method is that it does not require time for developing algorithms and the like before performing the information detection, as well as having a quite simply structured method of detection (and method of setting the comparison conditions).

Accordingly the present method ensures the detection of expected information using initial settings with no cut-and-try adjustments during a system test. Thus, any user who is not skilled in the art may use the present method for a broad range of information detection applications.

The above has been described with the premise that the known information 101 is provided and the samples for the information detection are collected from this known information, but it is also inversely important to collect samples from the unknown information 102 to find known information 101, or to set the input data 125 for information analysis based on human judgments and assumptions.

In such a case, a plurality sets of first comparison data, i.e., the first input data 125, may be prepared since this data strongly influences the detection results; or a range of input data may be prepared to perform the detection and the range of the input data may be gradually narrowed depending on the results of the first comparison.

Such an analysis technique substantially reduces the time and effort required for data analyses including information forecast in any area such as astronomy, weather, physics, chemistry and economy.

Provided with the information refinement function, the memories 121, 121a, 121b eliminate sequential memory processing, which is inevitable in the von Neumann-architecture computers, and these memories per se have intelligence knowledge and perform the information detection to thereby defy the common sense of conventional memories.

Thus, these memories may be utilized for a wide variety of fields including image recognition, speech recognition, OCR character recognition, full-text search, fingerprint authentication, iris authentication, pattern recognition by a robot artificial intelligence, which have been studied and used, in addition to analyses of the weather, economy, stock prices, molecular structures, DNA, genomes, character arrays (including computer virus patterns) and the like as well as information discovery (information forecast), social infrastructures, industrial installations, home equipment and other areas which have never been subject to information detections.

Embodiment Example 12

The memories 121, 121a, 121b provided with the information refinement function may be utilized for intelligence processing as artificial intelligence engines which need to detect various information.

The memories 121, 121a, 121b may be used in countless applications; for example, they may be considered as the cerebrum and cerebellum, or the right and left sides of the human brain, and a plurality of these memories may be arranged in parallel or hierarchy, wherein each of these memories may store various known information such as object, person, character, audio, taste and tactile recognition information as templates; simultaneously identify various information in a manner similar to that of human recognition abilities by comparing the templates with images and sounds provided realtime from its surroundings or with known information from various sensors; and utilize the results for extremely advanced intelligence processing such as executing an optimal action that it selects from its stored information.

In this case, information which is stored as templates is known information and information which is entered from the sensors is unknown information; this relationship is the opposite to the above descriptions.

Figure 17:
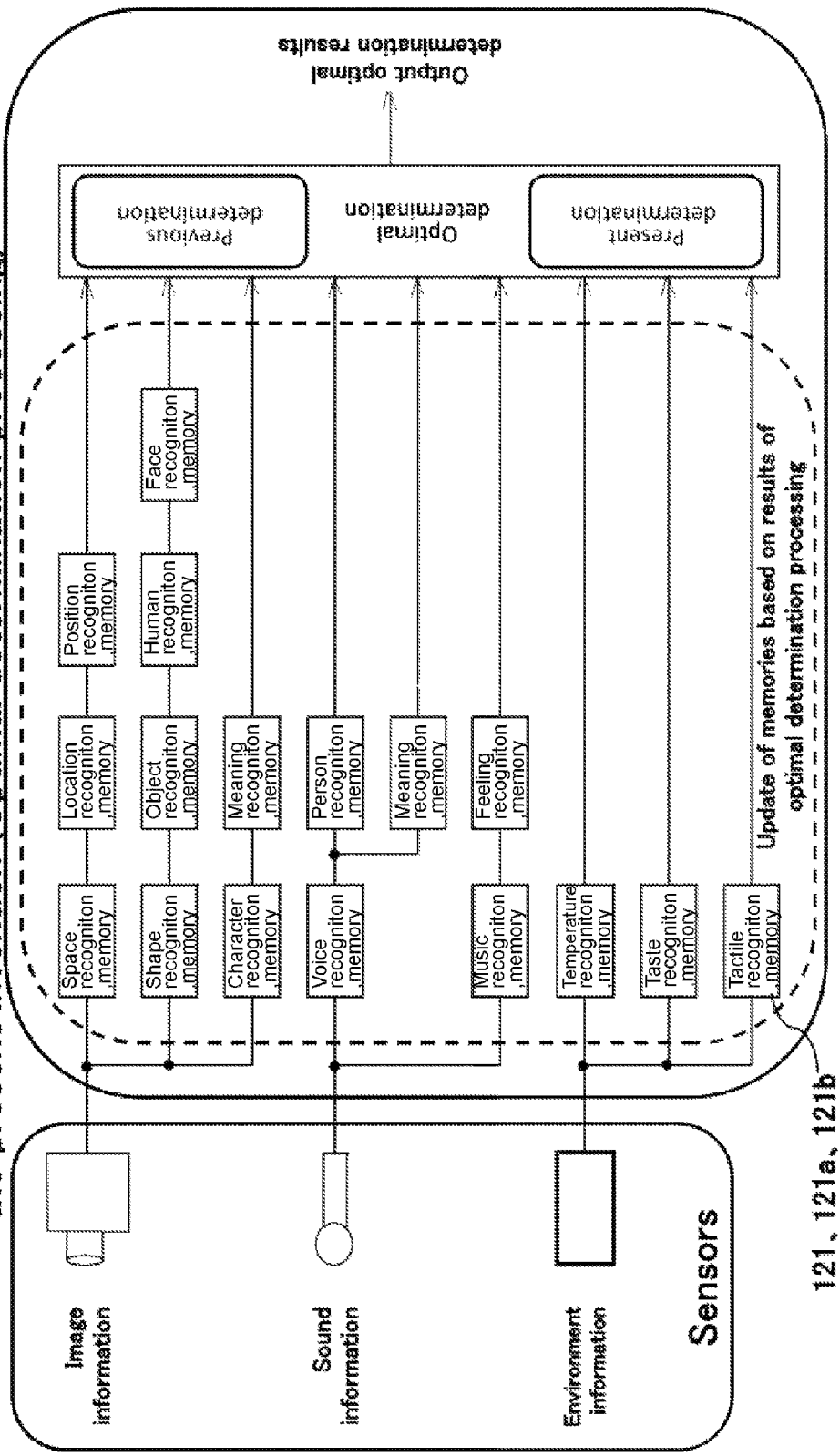
FIG. 17 depicts an example of advanced knowledge processing using memories (Embodiment Example 12)

FIG. 17 (an example of advanced intelligence processing using memories) depicts an embodiment example of storing the knowledge information in the memories 121, 121a, 121b and performing the intelligence processing; wherein learning by the memories 121, 121a, 121b may be easily effected by updating these memories based on a result of the optimal action.

Ideally, the above memories are incorporated in one-chip semiconductor integrated circuit (System On a Chip) in particular and used as a system, but in cases where memories of this structure may not be utilized for technical or economical reasons, a following method of comparing addresses according to the present invention allows far more efficient and fast information detection than conventional information detections.

The following is applicable where a system is structured in a semiconductor integrated circuit which systemizes several semiconductor chips together (System in a Package) as well as a circuit which implements several semiconductor integrated circuits and peripheral parts on a printed circuit board (System on a Board).

Embodiment Example 13

Figure 18:
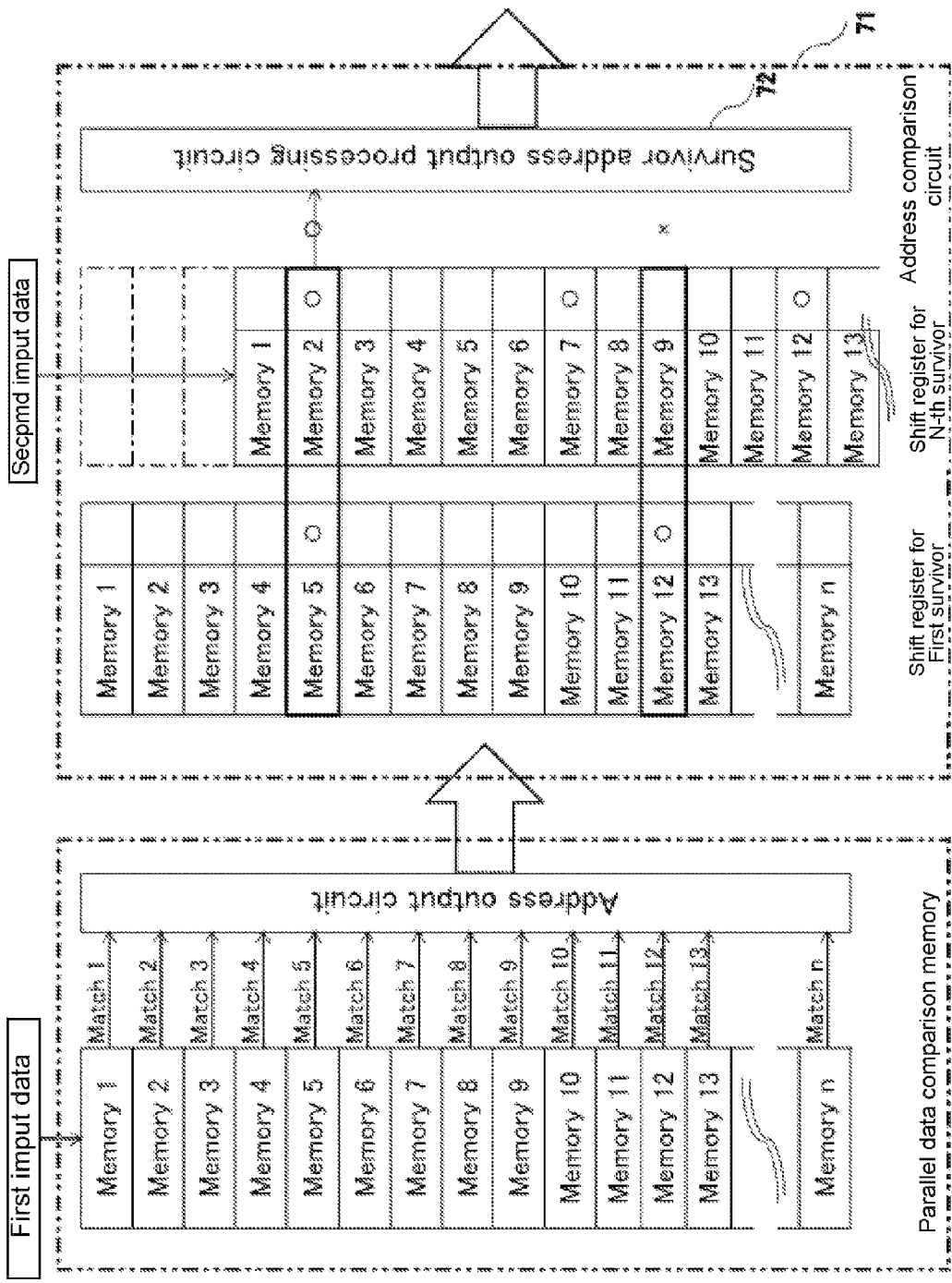
FIG. 18 depicts a structural diagram A of an address comparison circuit (Embodiment Example 13)

FIG. 18 is a structural diagram A of an address comparison circuit and depicts a basic structure having an address comparison circuit 71 for a memory outside of this memory.

This figure illustrates the concept of the present invention similar to ones discussed above and details such as processing timing are omitted.

As shown in FIG. 18, the memory in this figure is, for example, a content-addressable memory or the like which is capable of comparing memory data in parallel, and this memory determines in parallel a memory data match/mismatch according to first input data, outputs matching addresses and stores these output results from this memory in both of a shift register for first survivor addresses of the address comparison circuit 71 for a first comparison, and a shift register for N-th survivor addresses of the address comparison circuit 71 for subsequent comparisons, wherein the shift register for N-th survivor addresses shifts the respective stored addresses by a relative address according to second input data, compares in parallel the shift register for first survivor addresses and the post-shifting shift register for N-th survivor addresses, performs logical product (AND) operations and enters survivor addresses which match in both comparisons, in this case a memory address 5, in a circuit for outputting survivor addresses.

In other words, the final output of this memory is created by comparing in parallel data items of this memory according to the first input data for comparing the data items, outputting the results of the comparison and storing match/mismatch results for each address which is output, and subsequently comparing in parallel data items of this memory according to a new set of the first input data, outputting the results of the comparison, storing match/mismatch results for each address which is output and comparing the match/mismatch results of both addresses according to the second input data. In the present example, addresses are compared in parallel and the logical product (AND) operations are performed on the match/mismatch results, but logic operations other than logical product (AND) operations are possible.

Needless to say, the comparison between addresses is relative; although the first survivor addresses are fixed and the N-th survivor addresses are converted by the address swap (address transposition) according to the second input data in the structure of this figure, this relationship may be reversed.

A survivor address output circuit 72 refines detected information by repeatedly providing the first and second input data as a pair. Thus, results of the logic operations may be output in forms suited for different purposes from a counter circuit for counting the number of survival times, a priority encoder, or the like.

As described above, the second input data is for comparing addresses in the memory based on relative address data on an information array such as pattern information; in the above example of image data, the memory compares data a number of times according to the first input data and successively outputs an average of 488 matching addresses; as discussed above, the address comparison circuit 71 receives the 488 matching addresses for each comparison, uses the first survivor addresses as reference addresses, uses the relative addresses of the second input data as comparison data, compares addresses in parallel, performs the logical product (AND) operations on the match/mismatch results and outputs the results as the survival outputs.

This may be easily understood by considering that relative address relationships are compared between corresponding addresses in two address groups, each of which consists of the average 488 addresses per comparison, and addresses whose relative relationship match (logical products) are obtained.

Accordingly this may be any memory, such as a content-addressable memory, which is capable of comparing memory data in parallel and externally outputting the data comparison results in association with their respective addresses.

Embodiment Example 14

Figure 19:
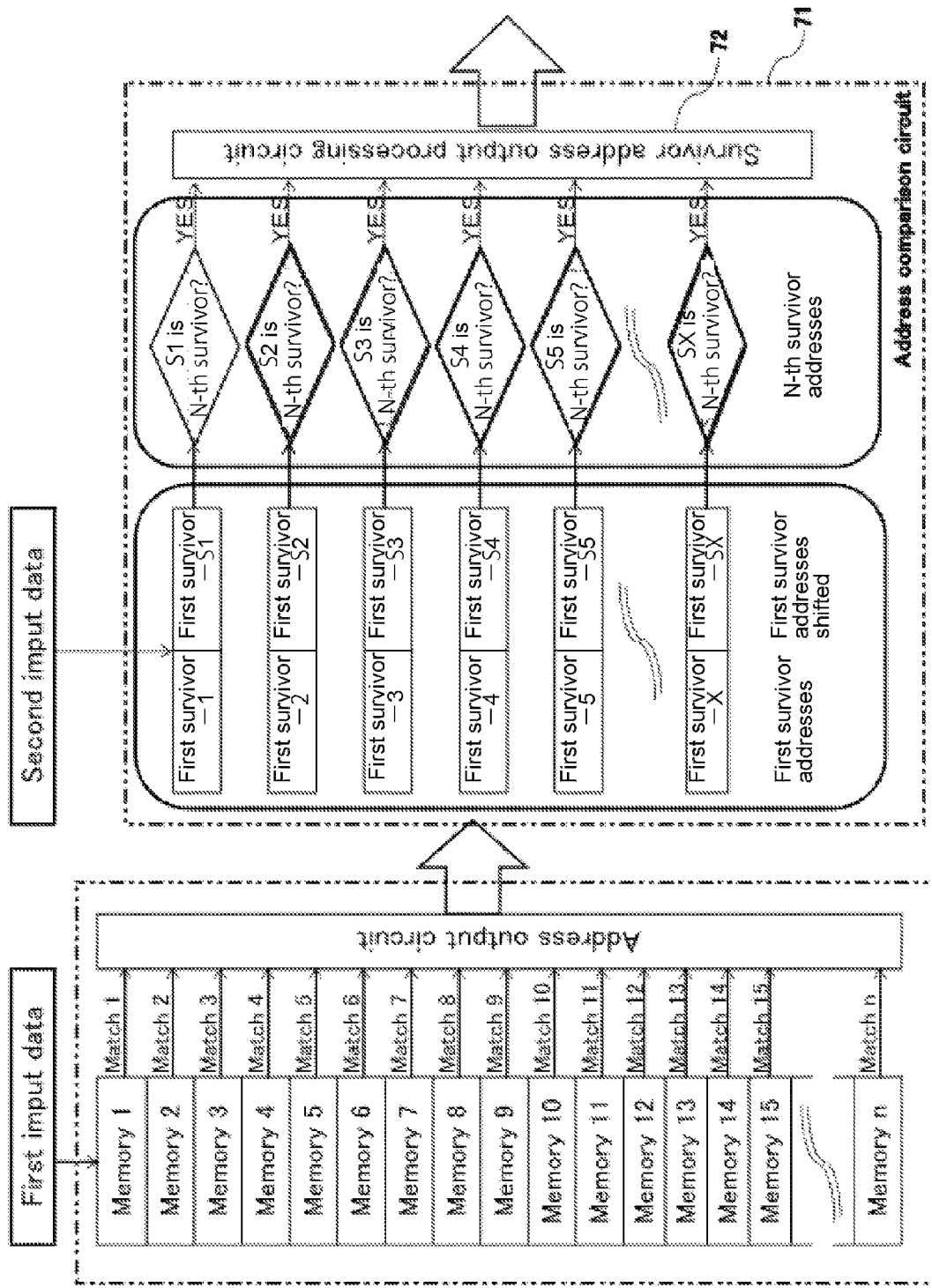
FIG. 19 depicts a structural diagram B of an address comparison circuit (Embodiment Example 14)

FIG. 19 is a structural diagram B of an address comparison circuit. An address comparison circuit 71 shown in FIG. 18 was provided with a shift register accommodating the number of memory addresses and compared all of the addresses in a one-to-one correspondence, but this structure is simplified in FIG. 19, where the first survivor addresses 56 are shifted.

The address comparison circuit 71 in FIG. 19 sequentially stores only the matching addresses, which have been output from the memory, as results of the first and subsequent N-th data comparisons based on the first input data, relatively shifts each of the first survivor addresses according to the second input data, determines whether each of the N-th data comparison results of the shifted reference first survivor addresses (indicated as addresses S1 to SX in the figure) is a match and outputs the matching addresses.

In this case, since the numbers of first and N-th survivor addresses are significantly smaller than the number of overall memory addresses, the comparison between these survivor addresses substantially may reduce the number of circuits used for this comparison.

Although not limited by the above two examples, if the first survivor addresses are used as reference addresses with the N-th survivor addresses in every comparison in order to output the matching address as results, the comparison does not necessarily need to be performed in parallel, but may also be performed sequentially.

Further, other than the logical product (AND) operations, the comparison of addresses may be performed by exclusive logic operations, a multiplexed comparison among three address groups, a comparison of relative positional relationships of the match/mismatch results or any other form of address comparison depending on its purpose.

Also when detecting similar information as discussed above, or when the memory contains various information therein, various address conditions such as an address range may be specified for comparing addresses, and when the first survivor addresses and the subsequent N-th survivor addresses may be compared, the address comparison circuit may have any structure; needless to say, the address comparison may be performed using coordinate data corresponding to the compared addresses.

The need for sequential processing on individual memory addresses is eliminated by the memory provided with the information refinement function, but as described above, the present method also allows the average 488 sequential address outputs per comparison to enable the comparison and detection processes for information on the entire memory; this method may be repeated to drastically improve the information detection speed compared to the conventional round-robin-style information detections.

An address refinement circuit may be incorporated into the memory to further reduce the 488 sequential address outputs per comparison.

Embodiment Example 15

Figure 20:
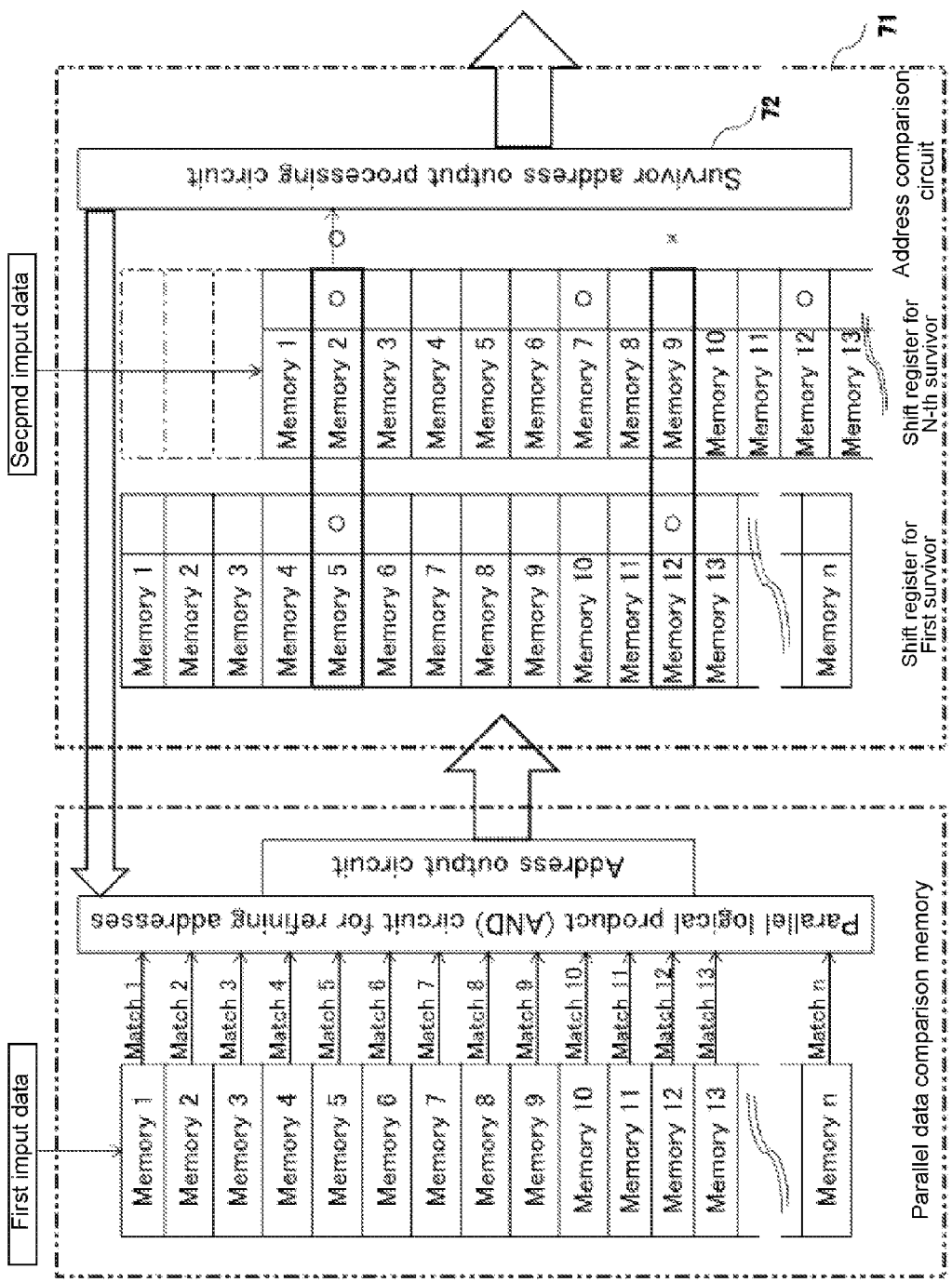
FIG. 20 depicts a structural diagram C of an address comparison circuit (Embodiment Example 15)

FIG. 20 is a structural diagram C of an address comparison circuit. As shown in this figure, address outputs from the survivor address output circuit 72 of the address comparison circuit 71 are entered as feedback to a parallel logical product (AND) circuit for refining addresses of the memory.

In this structure, the output addresses from the survivor address output circuit 72 upon each comparison are already narrowed down to the N-th survivor addresses as described above, an address output circuit of the memory does not need to output irrelevant addresses which are not subject to comparisons, wherein although the number of the initial output addresses may be 488, the number of the subsequent N-th output addresses may be refined to an extremely limited value.

In this case, since the memory simply needs to store the feedback addresses and perform logical product (AND) operations of the stored addresses and their respective match/mismatch results, an extremely simply circuit may implement these procedures and, if used in combination with the address comparison circuit 71, this circuit may significantly reduce the time required for the second and subsequent address comparisons although the first address comparison (to detect the first survivor addresses) may be somewhat time consuming.

In the above discussion, the address comparison circuit 71 and its address comparison method are implemented outside of the memory, but the circuit 71 may be implemented as an independent circuit, incorporated into another circuit or function for other purposes, implemented as a semiconductor integrated circuit, or incorporated into another semiconductor integrated circuit for other purposes.

Such an address comparison is attainable because detections of pattern information arranged in one- to multi-dimensional arrays may only be achieved by defining the first survivor addresses as the reference addresses and comparing the subsequent addresses (coordinate data) as the second input data based on the reference addresses (coordinate data).

Information detection using a memory-based architecture of another embodiment will be discussed below.

In the following, the memory provided with the information refinement detection function 121 is described simply as an information detection memory 81.

Figure 21:
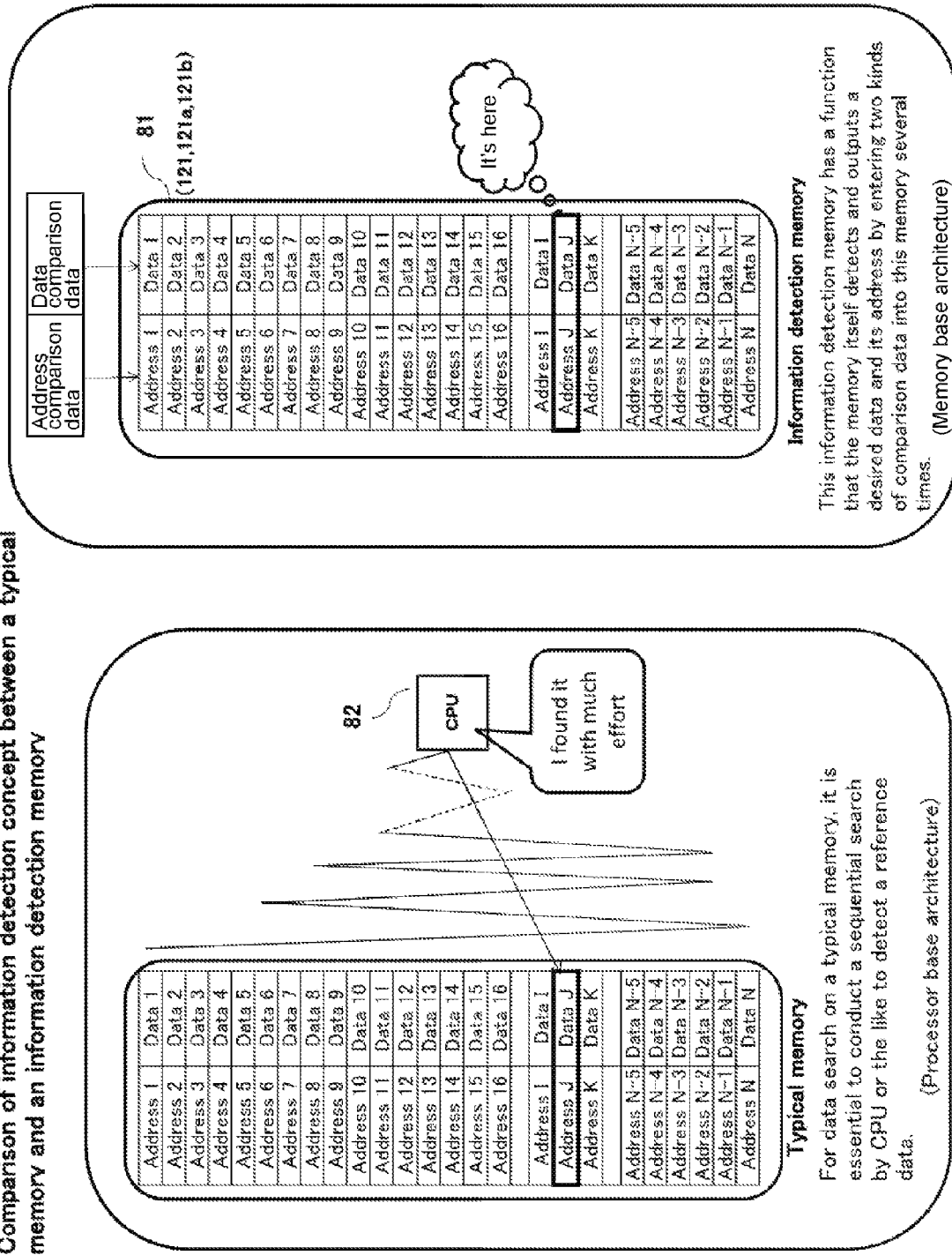
FIG. 21 depicts a comparison of information detection concepts of a typical memory and an information detection memory.

FIG. 21 (comparison of information detection concept between a typical memory and an information detection memory) depicts a basic concept of the present invention; when looking for desired information from within a typical memory, it is essential to perform information search and detection using a CPU 82, which locates the information.

Whereas, information detection using an information detection memory essentially eliminates the need for the information search since the information detection memory directly detects and locates an address (or addresses) of desired information.

The above compares and illustrates the characteristics of the processor-based information processing system and the memory-based information processing system. The present example requires two kinds of comparison data, i.e., data and addresses, but an information search memory capable of comparing data with various added data such as data types or data registration time is also possible.

Embodiment Example 16

Figure 22:
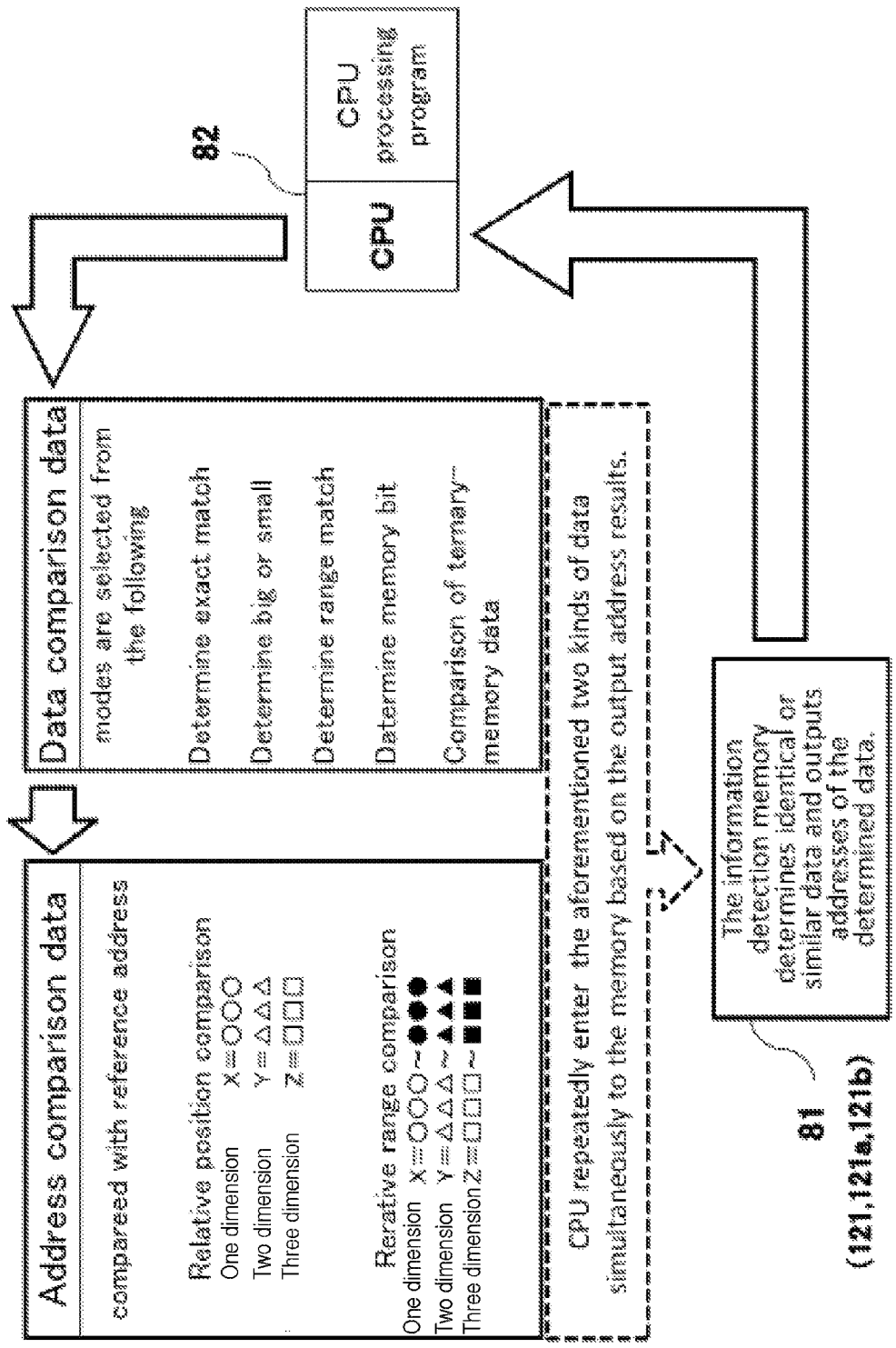
FIG. 22 depicts an information processing example of comparison data (Embodiment Example 16)

FIG. 22 (an information processing example of comparison data) depicts an information processing example where two structural examples of comparison data is entered by a CPU.

In this figure, first survivor addresses are used as reference addresses (coordinates) for address comparison data and one- to multi-dimensional positions or ranges are entered as comparison data depending on the arrangement of information subject to detection.

Also for data comparison data, any mode of data match may be specified from options such as perfect match, greater than, less than, within a range, bit sense and ternary-memory comparison before entering the comparison data.

This example illustrates a structure where the above comparison data is entered by a CPU; this CPU also reads and performs information processing on address outputs from an information detection memory 81 of this memory-based architecture which is integrated with a processor-based information processing system.

As discussed above, the CPU 82 is a device capable of any information processing except that it is not good at finding information; the CPU 82 used in combination with a device of the information detection memory 81 (an information detection device) may substantially accelerate the advancement of information processing systems.

This information detection memory 81 may be used for information such as the following which are data arrays tabulated and stored in corresponding addresses:

(1) one- to multi-dimensional pattern data such as image or audio data, (2) data for a database such as data for information searches, (3) data for inferences such as AI (artificial intelligence) inferences, and (4) program data for processor operations such as by a CPU.

If the above program data for processor operations in particular is used in an information processing system where the CPU 82 operates on this data, the system may become an extremely efficient and fast information processing system which integrates the memory-based and processor-based architectures as discussed above.

The above is only an example of the present invention and the information processing system may be constructed in any other suitable manners.

Embodiment Example 17

Figure 23:
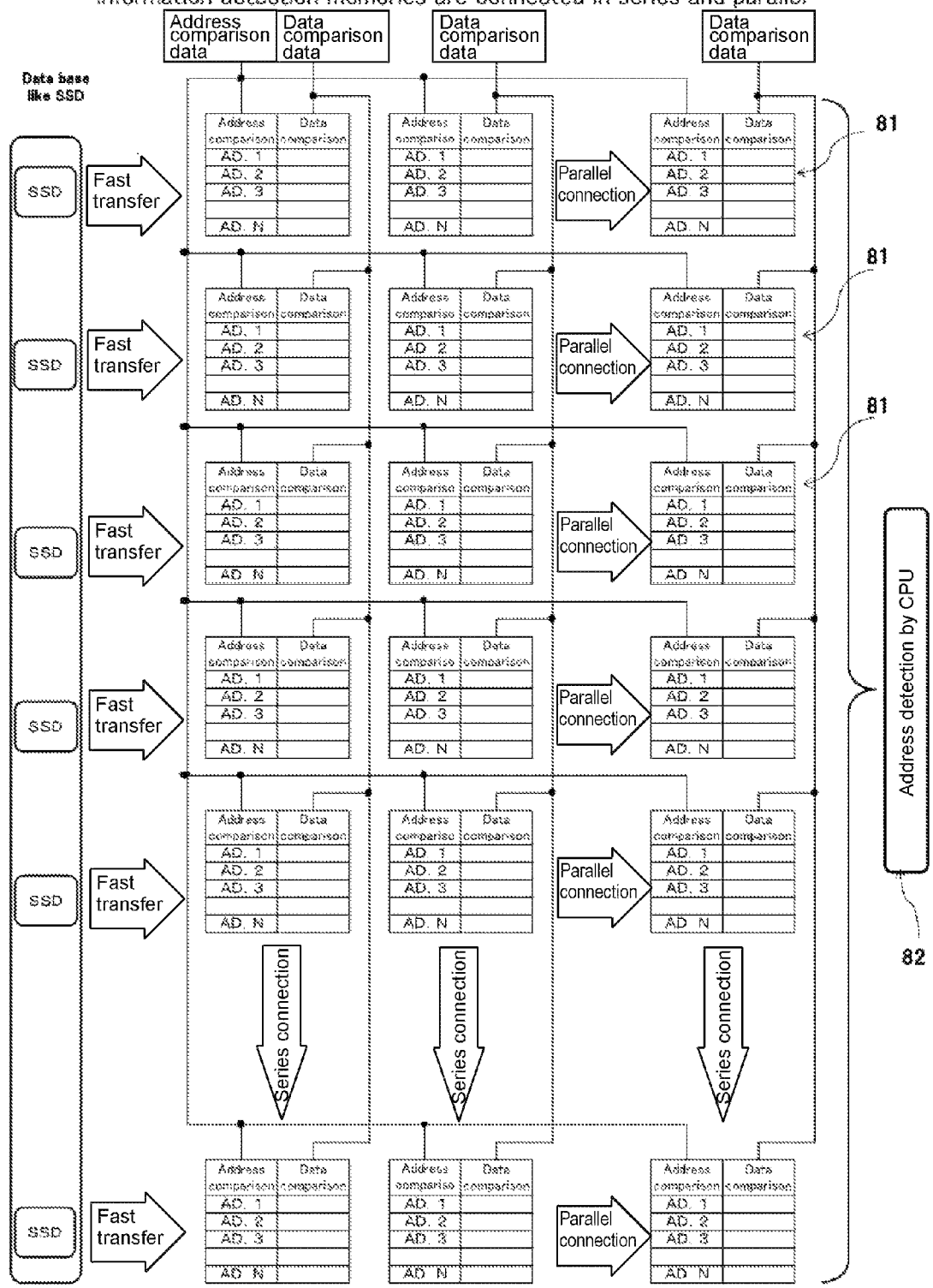
FIG. 23 depicts an example of a fast database-information detection device which connects information detection memories in series and parallel (Embodiment Example 17).

FIG. 23 (an example of a fast database-information detection device in which information detection memories are connected in series and parallel) depicts an example device for using a plurality of information detection memories 81 and reading the memories 81 by a CPU 82.

In recent years, memory capacities has been dramatically expanded and also solid state drives (SSDs) have been used in place of hard disk drives (HDDs).

Compared to HDDs, SSDs are slightly more expensive, but are more impact-resistant and consume less electricity as well as allowing random accesses, resulting in a wide use for databases.

On the other hand, the information detection memory 81 has more complicated internal circuit structure compared to conventional memories for merely storing information and requires functions to enter the comparison data and to output detected addresses, resulting in a lower storage capacity and a higher cost than the conventional memories.

Accordingly, desired information may be efficiently and rapidly detected from vast information in a database by connecting the information detection memories 81 in series and parallel, transferring and collectively providing required data from a SSD as comparison data and reading the resulting output addresses by the CPU 82 as shown in the figure.

This is an example in which typical memories, the information detection memories 81 and the CPU 82 are integrated, in other words, the memory-based and processor-based architectures are integrated to thereby create an extremely efficient and fast information processing system.

The present invention is intended to provide a novel information processing system for eliminating the need for information searches; the present invention also provides a method of detecting information based on a memory, which memory itself is capable of detecting information, and this method comprises the steps of: providing the memory with comparison data; reading addresses which is output from the memory and information of the respective addresses; and directly detecting desired information from the memory without searching through individual addresses of the memory for the desired information.

Also the present invention enables an input of novel comparison data for the information detection memory which is not limited by the two kinds of comparison data of prior invention, i.e., data and addresses, wherein the above novel comparison data, in combination with addresses which is output as data comparison results by the above method of detecting information based on a memory, eliminates the need for the information search by CPU's and heavy load caused thereby for the faster information detection.

INDUSTRIAL APPLICABILITY

The memories 121, 121a, 121b, 81 transcend the concept of conventional memories, have a broad range of applications and build a new stream of information processing.

The memories 121, 121a, 121b, 81 may be implemented as memories configured as RAMs or ROMs for general use using programmable logic devices (PLDs) such as ASICs (application-specific integrated circuits) and FPGAs (field-programmable gate arrays), as well as content-addressable memories; also the memories 121, 121a, 121b, 81 may be incorporated into cell-based CPUs or CCD sensors; further, the memory 21 of the present invention may be implemented in a unique exclusive memory structure, structured with a novel type semiconductor, or freely combined with other functions.

In the future, memories using novel devices such as photonic, magnetic and Josephson devices which are still in the process of research and development could be possibly applied to the present invention other than the semiconductor-based memories discussed above.

The above address comparison circuit has a quite simple structure and a high degree of freedom, and may be easily implemented in extensive applications from a device for detecting pattern information arranged in one- to multi-dimensional arrays to an artificial intelligence for processing knowledge.

Also by using a plurality sets of a memory and its address comparison circuit, the speed and efficiency of information detection through a large capacity of database may be improved.

Since the information detection of the present invention may be implemented by simple comparisons of both data and addresses, it is also easily used in place of, for example, a memory for comparing data in parallel in order to detect desired information using a plurality of lookup tables which are extracted from identical database, other than to speed up information detections.

With its above ability to detect information from a memory, the present invention may significantly reduce the load of information searches on CPU's (central processing units), greatly improve the overall information processing performance and benefit the information processing as a whole.

By obviating the need for information searches, the information processing system of the present invention drastically improves the information processing efficiency, and integrates conventional processor-based information processing done by CPU's with the memory-based information processing of the present invention to thereby build a novel information processing system.

It should be noted that the present invention is not limited to the above embodiments, and that various changes and modifications can be made without departing from the scope and spirit of the invention.

BRIEF DESCRIPTION OF THE SYMBOLS

71 Address comparison circuit
72 Survivor address output circuit
81 Information detection memory
82 CPU
101 Known information
102 Unknown information
103 Addresses
111 Pixel
113 Sampling point
121, 121a, 121b Memory provided with the information refinement detection function
122 Addresses bus
123 Data bus
124 Output bus
125 Input data
126 Memory comparison data
127 Address comparison data
128 Reset signal
129 Number-of-comparisons counter 129
131 Address decoder
132 Memory
133 Data comparison circuit
134 Address swap circuit
135 Number-of-survivals counter
136 OR gate
137 Inhibit gate
138 Survivor address output processing circuit
141 Pre-address-swap match output
142 Post-address-swap match output
143 Number-of-comparisons signal
144 Cascade connection
158 Number-of-survivals counter by group 158

What is claimed is:

1. A computer-readable memory provided with an information refinement detection function including a content-addressable memory (CAM) capable of storing information in each memory address, comprising:
   (1) an input section for entering first comparison data for being compared in parallel with each data item of the information stored in each memory address and second comparison data for comparing in parallel memory addresses, wherein the first and second comparison data are externally provided;
   (2) a first determining section for determining and outputting a data match/mismatch result by comparing in parallel the each data item of the information stored in each memory address with the first comparison data; and
   (3) a second determining section for determining and outputting a memory address match/mismatch result for each memory address by comparing in parallel between the memory addresses the data match/mismatch results of each memory address determined by the first determining section, according to the second comparison data;

wherein the second determining section comprises a logic operation section for applying a logic operation between the data match/mismatch results of each memory address, wherein the logic operation of the memory is a logical product (AND) operation, and the memory further comprising:

(1) a storing section for storing at least one or more addresses which are determined to have the data match result to become first survivor addresses when the each data item stored in the memory is compared in parallel with the first comparison data in a first information detection;

(2) an address transposition section for transposing memory addresses, which are determined to have the data match result when the each data item stored in the memory is compared in parallel with a new set of the first comparison data in subsequent information detections, to obtain transposed addresses by transposing, using a shift register, the memory addresses according to the second comparison data; and (3) a first output section for outputting addresses which are determined to pass the logical product (AND) operation applied on the first survivor addresses and the transposed addresses.

2. The memory provided with the information refinement detection function of claim 1, further comprising:

(1) a plurality of counters for respectively counting the number of the data match/mismatch results for individual memory addresses according to the first and second comparison data provided a predetermined number of times;

(2) a counting-up section for counting up a value of each counter for the memory address having the data match result to 1, and obtaining the memory addresses having the data match result as the first survivor addresses in the first information detection;

(3) a cumulatively counting-up section for cumulatively counting up the value of each counter for the first survivor address to N, where N is a number of comparisons equal to or greater than 2, to obtain N-th survivor address if the transposed address is the same as the first survivor address in the subsequent information detections and to determine the N-th survivor address as the address which passed the logical product (AND) operation; and (4) a second output section for outputting the N-th survivor addresses.

3. The memory provided with the information refinement detection function of claim 2, wherein the second output section for outputting the N-th survivor addresses performs the output through one or both of:

(1) a data bus; and
(2) a dedicated output.

4. The memory provided with the information refinement detection function of claim 2, wherein the storing section for storing the first survivor addresses in the first information detection, is added to the plurality of counters to thereby reduce the number of the counters for individual memory addresses, wherein the number of the counters is the number of addresses divided by n, and wherein n is a natural number.

5. A method of detecting information identical or similar to reference information, wherein the detecting information is performed in the memory provided with the information refinement detection function of claim 2, the method comprising:

repeatedly providing the input section with the first comparison data, the first comparison data being a plurality of comparison samples necessary and sufficient to detect the information identical or similar to the reference information; and detecting the information identical or similar to the reference information from information stored in the memory based on the N-th survivor addresses output from the memory.

6. The method of claim 5, wherein the comparison samples for detecting information are extracted based on a sample characteristic quantity derived by calculating an absolute value of a data difference between each pair of adjacent samples and totaling all of the absolute values.

7. The method of claim 5, wherein in the first information detection, first comparison samples are optimally selected from a plural types of samples before the first comparison data for determining the first survivor addresses is provided to the input section.

8. The method of claim 5, wherein in the first information detection, a range of data is provided as the first comparison data before the first comparison data for determining the first survivor addresses is provided to the input section.

9. The memory provided with the information refinement detection function of claim 1, wherein the address transposition means transposes the entire addresses in the memory in parallel according to the second comparison data.

10. The memory provided with the information refinement detection function of claim 9, further comprising:

one or more processors for performing functions of the address transposition section.

11. The memory provided with the information refinement detection function of claim 1, wherein the second comparison data uses the first survivor addresses as reference addresses, and wherein, in the subsequent information detections, the second comparison data is one of:

(1) comparison data for determining whether relative positions between the memory addresses having the data match result and the reference addresses are the same; and (2) comparison data for determining whether the memory addresses having the data match result exist within a predetermined range relative to the reference addresses.

12. The memory provided with the information refinement detection function of claim 1, wherein a structure of the memory is directed to detecting at least one of:

(1) information stored or storable as one-dimensional information including audio information;
(2) information stored or storable as two-dimensional information including image information;
(3) information stored or storable as three-dimensional information including three-dimensional-object information;
(4) information stored or storable as multi-dimensional information including spatio-temporal information; and
(5) information stored or storable by an address group including clustering information.

13. The memory provided with the information refinement detection function of claim 1, wherein the first comparison data for comparing in parallel the data items stored in the memory is comparison data for performing at least one of:

(1) detecting exact matches with the data items;
(2) detecting whether it is big or small relative to the data items;

(3) detecting whether it is within or outside a range relative to the data items;
(4) comparing and detecting individual memory bits; and
(5) comparing and detecting ternary-memory data items.

14. The memory provided with the information refinement detection function of claim 1, wherein the input section for entering the first and second comparison data is one or both of:
(1) a data bus; and
(2) a dedicated input.

15. The memory provided with the information refinement detection function of claim 1, wherein the first output section for outputting the addresses which are determined to pass the logical product (AND) operation performs the output through one or both of:
(1) a data bus; and
(2) a dedicated output.

16. The memory provided with the information refinement detection function of claim 1, wherein the memory is configured to divide a memory range into segments and perform functions of the first determining section, the second determining section and the logic operation section.

17. The memory provided with the information refinement detection function of claim 1, wherein the memory comprises a plurality of the input sections, a plurality of the first determining sections, a plurality of the second determining sections and a plurality of logic operation sections in parallel.

18. The memory provided with the information refinement detection function of claim 1, wherein the memory is incorporated and used in a semiconductor for purposes including a CPU.

19. A method of detecting information identical or similar to reference information, wherein the detecting information is performed in the memory provided with the information refinement detection function of claim 1, the method comprising:
providing the input section with the first comparison data for the first information detection and the new set of first comparison data for the subsequent information detections wherein the comparison data are associated with the reference information; and
detecting the information identical or similar to the reference information from information stored in the memory based on the output addresses which are determined to pass the logical product (AND) operation and output from the memory.

20. The method of claim 19, wherein the information identical or similar to the reference information is pattern information.

21. The memory provided with the information refinement detection function of claim 20, wherein the pattern information is a computer virus pattern.

22. The method of claim 19, wherein the information detection is performed using the memory in combination with a CPU capable of accessing the memory, and reading and writing data stored in the memory.

23. The method of claim 19, wherein knowledge processing is performed by storing the pattern information as knowledge information in the memory and detecting the pattern information.

24. A device comprising the memory provided with the information refinement detection function of claim 1.

25. The memory provided with the information refinement detection function of claim 1, wherein
the first determining section is configured to determine the data match/mismatch result for each of the memory addresses by comparing in parallel the each data item stored in the memory with the first comparison data and subsequently determine the data match/mismatch result for each of the memory addresses by further comparing in parallel the each data item stored in the memory with a new set of the first comparison data; and
the second determining section is configured to determine the memory address match/mismatch result by comparing in parallel the addresses with the data match/mismatch result according to the first comparison data and the addresses with the data match/mismatch result according to the new set of the first comparison data according to the second comparison data.

26. The memory provided with the information refinement detection function of claim 1, wherein
the first determining section is configured to sequentially provide the memory with a plural types of the first comparison data and determine the data match/mismatch result each time the first comparison data is provided; and
the second determining section is configured to use the memory addresses having the data match result according to the first comparison data of the first information detection as reference addresses, and determine the memory address match/mismatch result between the reference addresses and the memory addresses having the data match results according to the first comparison data in each of the subsequent information detections according to the second comparison data provided for each of the first comparison data in the subsequent information detections.

27. The memory provided with the information refinement detection function of claim 1, wherein
the second comparison data depends on the first comparison data and indicates a relative relationship between addresses in the memory.

28. The memory provided with the information refinement detection function of claim 1, wherein
the addresses comparison of the second determining section is performed on at least one of:
(1) all addresses;
(2) addresses having the data match result according to the first comparison data; and
(3) specified addresses.

29. The memory provided with the information refinement detection function of claim 1, further comprising:
a two or more dimensional coordinate conversion table corresponding with each memory address,
wherein the input section enters the second comparison data as coordinate data.

30. The memory provided with the information refinement detection function of claim 1, further comprising:
a refining section for refining the memory addresses having the data match result by the first determining section, according to a result from the logic operation section.

31. The memory provided with the information refinement detection function of claim 1, wherein
the information stored in the addresses is pattern information arranged in a one- or multi-dimensional array.

32. The memory provided with the information refinement detection function of claim 1, further comprising:
a memory-address comparison circuit,
wherein the memory-address comparison circuit comprises:
an input module to which the data match/mismatch results obtained by the first determining section are entered;
a determination module for determining the address match/mismatch result by comparing at least two types of data match/mismatch results entered via the input module according to the second comparison data;
a logic operation module for applying the logic operation for each of the addresses and in parallel to the data match/mismatch results obtained by the first determining section and the address match/mismatch result from the determination module; and
an output module for outputting addresses with positive results of the logic operation obtained by the logic operation module.

33. The memory provided with the information refinement detection function of claim 32, wherein
the memory-address comparison circuit further comprises a counting module that counts for each of the memory addresses the number of matches which resulted from the logic operation of the logic operation section.

34. The memory provided with the information refinement detection function of claim 32, wherein
the memory-address comparison circuit is a semiconductor integrated circuit.

35. The memory provided with the information refinement detection function of claim 32, wherein
the memory-address comparison circuit is configured to include the logic operation module that performs a logical product (AND) operation, and wherein
the memory-address comparison circuit further comprises a logical product operation module for performing a logical product (AND) operation in parallel on addresses with a positive result of the former logical product (AND) operation and addresses having the data match results obtained by the first determining section.

36. The memory provided with the information refinement detection function of claim 1, wherein the memory is used in an artificial intelligence.

37. The memory provided with the information refinement detection function of claim 1, wherein the data stored in the memory is an arrayed data defining a relationship between each piece of information and its address in a table.

38. The memory provided with the information refinement detection function of claim 1, wherein
the address transposition is performed by transposing a set of address information which is stored in the memory and corresponding to the memory addresses.

39. The memory provided with the information refinement detection function of claim 1, wherein
the memory is configured to be a semiconductor integrated circuit.

40. The memory provided with the information refinement detection function of claim 1, wherein
the means (1) to (4) are implemented in one semiconductor integrated circuit chip.

41. The memory provided with the information refinement detection function of claim 1, wherein
the memory is incorporated in a programmable logic device (PLD) such as an FPGA (Field-Programmable Gate Array).

42. A method of detecting reference information from one or more computer-readable memories including a content-addressable memory (CAM) capable of storing each data item of information in each memory address, wherein
the memory comprises an input section for entering first comparison data for being compared in parallel with each data item of the information stored in the memory and second comparison data for comparing in parallel addresses in the memory,
the method comprising:
(1) entering the first comparison data in the memory by the input section and determining a data match/mismatch result by comparing in parallel the each data item stored in the memory with the first comparison data;
(2) entering the second comparison data in the memory by the input section and determining a memory address match/mismatch result by comparing in parallel the addresses in the memory according to the second comparison data; and
(3) applying a logic operation for each of the addresses and in parallel to the match/mismatch results obtained from both of the steps (1) and (2)
wherein the logic operation of the memory is a logical product (AND) operation, and the method further comprising:
(1) storing at least one or more addresses which are determined to have the data match result to become first survivor addresses when the each data item stored in the memory is compared in parallel with the first comparison data in a first information detection;
(2) transposing memory addresses, which are determined to have the data match result when the each data item stored in the memory is compared in parallel with a new set of the first comparison data in subsequent information detections, to obtain transposed addresses by transposing, using a shift register, the memory addresses according to the second comparison data; and
(3) outputting addresses which are determined to pass the logical product (AND) operation applied on the first survivor addresses and the transposed addresses.

43. The method of claim 42, wherein the memory comprises a plurality of counters for respectively counting the number of the data match/mismatch results for individual memory addresses according to the first and second comparison data provided a predetermined number of times,
the method further comprising:
(1) counting up a value of each counter for the memory address having the data match result to 1, and obtaining the memory addresses having the data match result as the first survivor addresses in the first information detection;
(2) cumulatively counting up the value of each counter for the first survivor address to N, where N is a number of comparisons equal to or greater than 2, to obtain N-th survivor address if the transposed address is the same as the first survivor address in the subsequent information detections and to determine the N-th survivor address as the address which passed the logical product (AND) operation; and
(3) outputting the N-th survivor addresses of the above (2).

44. The method of claim 43, further comprising the step of: instructing the plurality of counters to store the first survivor addresses in the first information detection.

45. The method of claim 42, wherein the entire addresses in the memory are transposed in parallel according to the second comparison data during the address transposition.

46. The method of claim 45, wherein the memory further comprises one or more processors for performing the address transposition.

47. The method of claim 42, wherein the second comparison data uses the first survivor addresses as reference addresses, and wherein, in the subsequent information detections, the second comparison data is one of:

(1) comparison data for determining whether relative positions between the memory addresses having the data match result and the reference addresses are the same; and (2) comparison data for determining whether the memory addresses having the data match result exist within a predetermined range relative to the reference addresses.

48. The method of claim 42, wherein the first comparison data for comparing in parallel the data items stored in the memory is comparison data for performing at least one of:

(1) detecting exact matches with the data items;
(2) detecting whether it is big or small relative to the data items;
(3) detecting whether it is within or outside a range relative to the data items;
(4) comparing and detecting individual memory bits; and
(5) comparing and detecting ternary-memory data items.

49. The method of claim 42, wherein each of the steps (1) to (3) of claim 43 are performed by dividing a memory range into segments.

50. The method of claim 42, wherein
in the step (1), the data match/mismatch result is determined for each of the memory addresses by comparing in parallel the each data item stored in the memory with the first comparison data and subsequently determine the data match/mismatch result for each of the memory addresses by further comparing in parallel the each data item stored in the memory with a new set of the first comparison data; and
in the step (2), the memory address match/mismatch result is determined by comparing in parallel the addresses with the data match/mismatch result according to the first comparison data and the addresses with the data match/mismatch result according to the new set of the first comparison data according to the second comparison data.

51. The method of claim 42, wherein
in the step (1), a plural types of the first comparison data is sequentially provided to the memory and the data match/mismatch result is determined each time the first comparison data is provided; and
in the step (2), the memory addresses with the data match result according to the first comparison data of the first information detection are used as reference addresses, and the reference addresses and memory addresses having the data match result according to the first comparison data in each of the subsequent information detections are compared according to the second comparison data provided for each of the first comparison data in the subsequent information detections to determine the memory address match/mismatch result.

52. The method of claim 42, wherein
the second comparison data depends on the first comparison data and indicates a relative relationship between addresses in the memory.

53. The method of claim 42, wherein
the address comparison by the step (2) of claim 42 is performed on at least one of:
(1) all addresses;
(2) addresses having the data match result according to the first comparison data; and
(3) specified addresses.

54. The method of claim 42, wherein
the memory further comprises two or more dimensional coordinate conversion table corresponding with each memory address, and wherein in the step (2) of claim 42, the second comparison data is entered as coordinate data via the input section.

55. The method of claim 42, further comprising:
Refining the memory addresses having the data match/mismatch result of the step (2) of claim 42, according to a result from the logic operation of the step (3) of claim 42.

56. The method of claim 42, wherein data stored in the memory is arrayed data for defining a relationship between each piece of information and its address in a table.

57. The method of claim 42, wherein
the address transposition is performed by transposing address information stored in the memory in correspondence with the memory addresses.

58. A computer-readable memory including a content-addressable memory (CAM) capable of storing information in each memory address, comprising:

(1) an input section for entering first comparison data for being compared in parallel with each data item of the information stored in the memory and second comparison data for comparing addresses in the memory;
(2) a first determining section for determining a data match/mismatch result by comparing in parallel the each data item stored in the memory with the first comparison data, and obtaining memory addresses having the data match result as first survivor addresses;
(3) a second determining section for determining the data match/mismatch result by comparing in parallel the each data item stored in the memory with a new set of the first comparison data subsequent to the first comparison data used by the first determining section, and obtaining memory addresses having the data match result as survivor addresses;
(4) a transposing section for transposing, using a shift register, either the first survivor addresses obtained by the first determining section or the survivor addresses obtained by the second determining section according to the second comparison data; and
(5) a logic operation section for applying a logic operation which is performed between each of the transposed first survivor addresses or the transposed survivor addresses obtained by the transposing section, and each of untransposed addresses.

59. The memory of claim 58, further comprising:
a counter for each of the memory addresses,
wherein the first determining section is configured to count up a value of each counter corresponding to the first survivor addresses to 1,
wherein the transposing section is configured to transpose the survivor addresses according to the second comparison data, and
wherein the logic operation section is configured to count up respective values of the counters corresponding to the first survivor addresses with positive results of the logic operation between the transposed survivor addresses and the first survivor addresses.

60. A computer-readable memory including a content-addressable memory (CAM) capable of storing information in each memory address, comprising:

(1) an input section for entering first comparison data for being compared in parallel with each data item of the information stored in the memory and second comparison data for comparing addresses in the memory;
(2) a plurality of match/mismatch storage (flagging) sections, respectively provided for the each memory address for storing (flagging) a match/mismatch state;

(3) a first determining section for determining a data match/mismatch result by comparing in parallel the each data item stored in the memory, with the first comparison data provided to the input section, and turning each of the match/mismatch storage (flagging) section, which is corresponding to each memory address having the data match/mismatch result, to a match state for flagging;

(4) a second determining section for determining the data match/mismatch result by comparing the each data item stored in the memory, with a new set of the first comparison data provided to the input section subsequent to the first comparison data, and obtaining memory addresses having the data match result as survivor addresses;

(5) a transposing section for transposing, using a shift register, the survivor addresses obtained by the second determining section according to the second comparison data to thereby obtain transposed addresses; and (6) an unflagging section for unflagging each of the match/mismatch storage (flagging) sections which are turned to the match state for flagging by the first determining section but not corresponding to the transposed addresses obtained by the transposing section.

* * * * *